United States Patent
Edman et al.

(10) Patent No.: US 9,515,282 B2
(45) Date of Patent: Dec. 6, 2016

(54) METHOD FOR MANUFACTURING A LIGHT-EMITTING ELECTROCHEMICAL CELL

(71) Applicant: LUNALEC AB, Umeå (SE)

(72) Inventors: Ludvig Edman, Umea (SE); Andreas Sandstroem, Umea (SE)

(73) Assignee: LUNALEC AB, Umeå (SE)

( * ) Notice: Subject to any disclaimer, the term of this patent is extended or adjusted under 35 U.S.C. 154(b) by 0 days.

(21) Appl. No.: 14/432,695

(22) PCT Filed: Nov. 14, 2013

(86) PCT No.: PCT/EP2013/073838
§ 371 (c)(1),
(2) Date: Mar. 31, 2015

(87) PCT Pub. No.: WO2014/064298
PCT Pub. Date: May 1, 2014

(65) Prior Publication Data
US 2015/0243920 A1 Aug. 27, 2015

(30) Foreign Application Priority Data

Oct. 26, 2012 (SE) ........................... 1251212
Nov. 21, 2012 (SE) ........................... 1251316

(51) Int. Cl.
*H01L 51/50* (2006.01)
*H01L 51/00* (2006.01)
(Continued)

(52) U.S. Cl.
CPC ....... *H01L 51/5032* (2013.01); *H01L 27/3209* (2013.01); *H01L 51/0004* (2013.01);
(Continued)

(58) Field of Classification Search
CPC ............. H01L 51/0004; H01L 51/5032; H01L 51/504; H01L 51/56
(Continued)

(56) References Cited

U.S. PATENT DOCUMENTS

| 4,539,507 A | 9/1985 | VanSlyke et al. |
| 5,247,190 A | 9/1993 | Friend et al. |

(Continued)

FOREIGN PATENT DOCUMENTS

| EP | 2395572 A1 | 12/2011 |
| JP | 2008243421 A | 10/2008 |

(Continued)

OTHER PUBLICATIONS

Apr. 8, 2014 International Search Report and Written Opinion issued in International Patent Application No. PCT/EP2013/073838 by Steve Welter.
(Continued)

*Primary Examiner* — Douglas Menz
(74) *Attorney, Agent, or Firm* — Hultquist, PLLC; Steven J. Hultquist

(57) ABSTRACT

A method for manufacturing a light-emitting electrochemical cell (LEC) is disclosed. The LEC comprises a first electrode, a second electrode, and a first light-emitting active material in electrical contact with and separating the first and second electrodes. The first active material comprises mobile ions in an amount sufficient for doping the active material. The method comprises a step of depositing the first active material by spray-coating at an ambient gas pressure of at least about 1 kPa.

20 Claims, 18 Drawing Sheets

(51) Int. Cl.
*H01L 51/52* (2006.01)
*H01L 51/56* (2006.01)
*H01L 27/32* (2006.01)

(52) U.S. Cl.
CPC .......... *H01L 51/502* (2013.01); *H01L 51/504* (2013.01); *H01L 51/5016* (2013.01); *H01L 51/5206* (2013.01); *H01L 51/5215* (2013.01); *H01L 51/5225* (2013.01); *H01L 51/56* (2013.01)

(58) Field of Classification Search
USPC .......................................................... 257/13
See application file for complete search history.

(56) References Cited

U.S. PATENT DOCUMENTS

| | | |
|---|---|---|
| 5,408,109 A | 4/1995 | Heeger et al. |
| 5,682,043 A | 10/1997 | Pei et al. |
| 7,115,216 B2 | 10/2006 | Carter et al. |
| 2011/0236675 A1 | 9/2011 | Oki et al. |
| 2012/0187387 A1 | 7/2012 | Sekiguchi et al. |
| 2013/0140541 A1 | 6/2013 | Kunz et al. |

FOREIGN PATENT DOCUMENTS

| | | |
|---|---|---|
| JP | 20129298 A | 1/2012 |
| JP | 201279773 A | 4/2012 |
| JP | 2013504663 A | 2/2013 |
| JP | 2013543628 A | 12/2013 |
| SE | 534257 C2 | 6/2011 |
| WO | 2011013760 A1 | 2/2011 |
| WO | 2011032010 A1 | 3/2011 |
| WO | 2011053236 A1 | 5/2011 |
| WO | 2012013270 A1 | 2/2012 |

OTHER PUBLICATIONS

Jun. 20, 2013 Office Action in Swedish Patent Application No. 1251316-4, issued by Cecilia Hakansson.
Jun. 20, 2013 Office Action in Swedish Patent Application No. 1251316-4, issued by Cecilia Hakansson [Machine Translation].
Asadpoordarvish, A., et al., "Encapsulating light-emitting electrochemical cells for improved performance", "Applied Physics Letters", May 10, 2012, pp. 193508_1-193508_4, vol. 100.
Mauthner, G., et al., "Inkjet printed surface cell light-emitting devices from a water-based polymer dispersion", "Organic Electronics", Apr. 2008, pp. 164-170, vol. 9, No. 2.
Reineke, S., et al., "White organic light-emitting diodes with fluorescent tube efficiency", "Nature", May 14, 2009, pp. 234-238, vol. 459.
Zhang, C., et al., "Blue emission from polymer light-emitting diodes using non-conjugated polymer blends with air-stable electrodes", "Synthetic Metals", May 1995, pp. 185-188, vol. 72, No. 2.
Aoki, Y., et al., "Stacking layered structure of polymer light emitting diodes prepared by evaporative spray deposition using ultradilute solution for improving carrier balance", "Thin Solid Films", Jul. 9, 2009, pp. 493-496, vol. 518.
Bharathan, J., et al, "Polymer electroluminescent devices processed by inkjet printing: I. Polymer light-emitting logo", "Applied Physics Letters", May 25, 1998, pp. 2660-2662, vol. 72, No. 21.
Sandstroem, A., et al., "Ambient fabrication of flexible and large-area organic light-emitting devices using slot-die coating", "Nature Communications", Aug. 14, 2012, pp. 1-5, vol. 3, No. 1002.
Tang, S., et al., "A Solution-Processed Trilayer Electrochemical Device: Localizing the Light Emission for Optimized Performance", "J. Am. Chem. Soc.", Aug. 3, 2012, pp. 14050-14055, vol. 134.

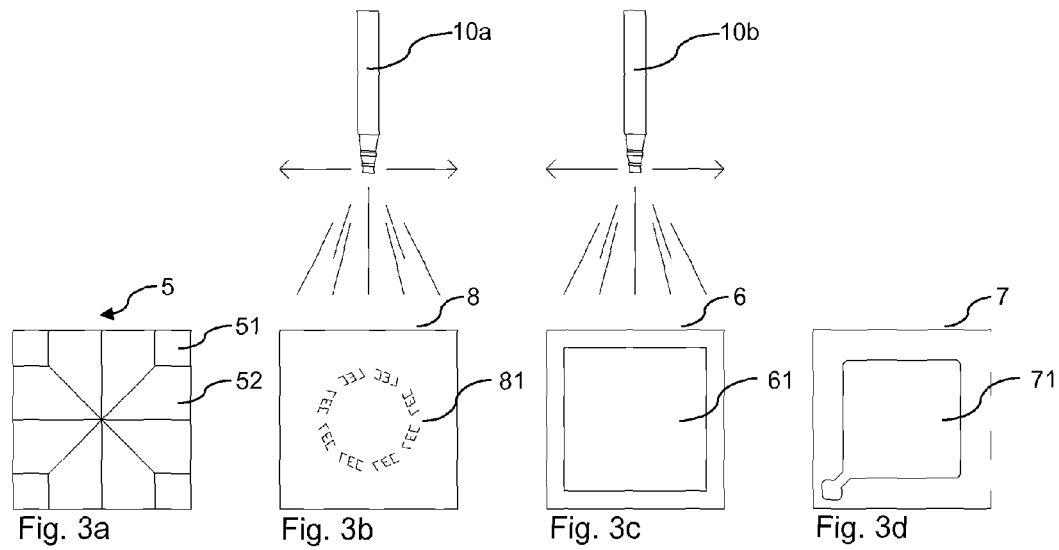
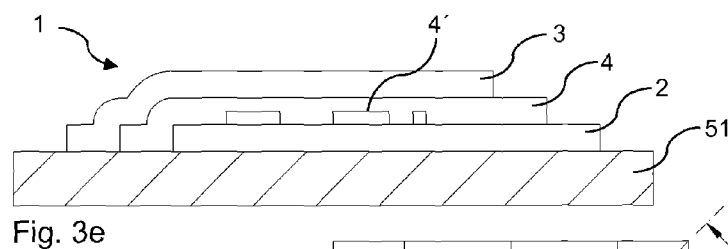
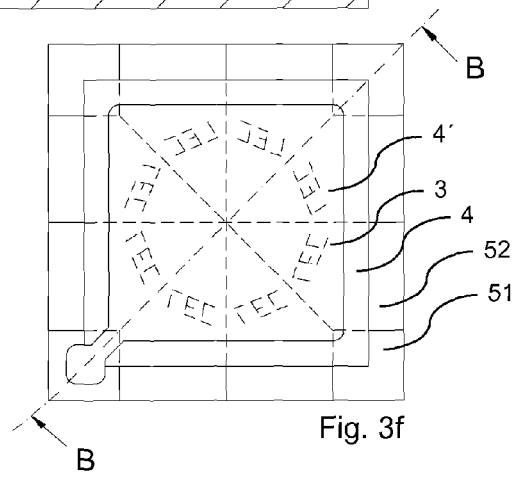

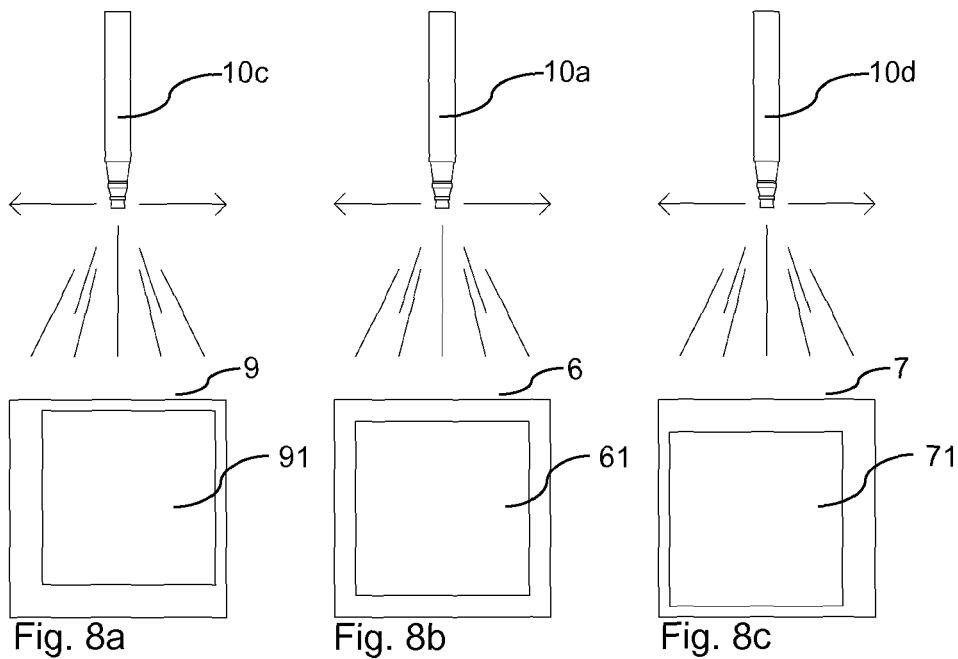
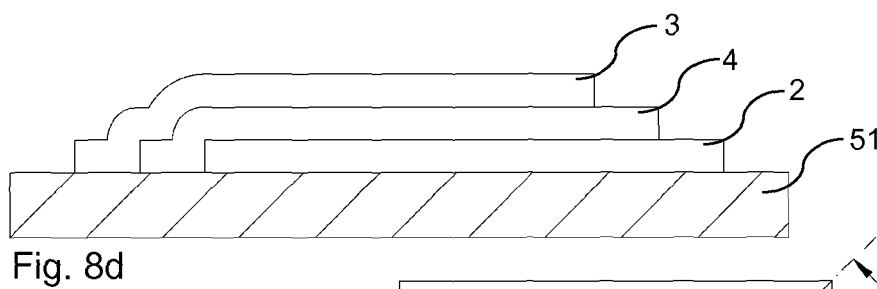
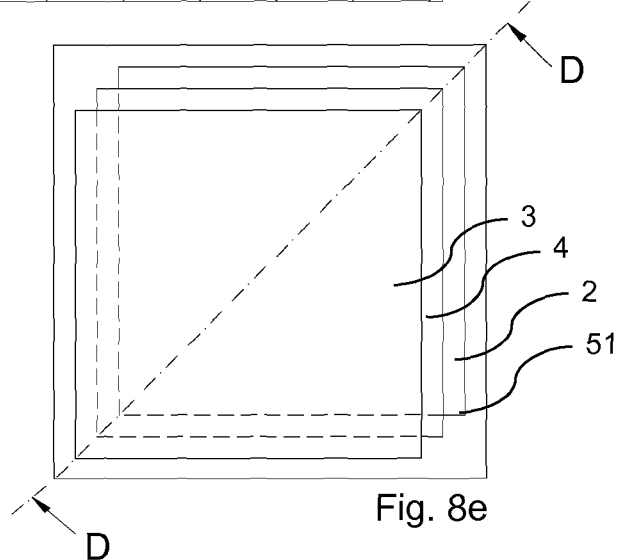

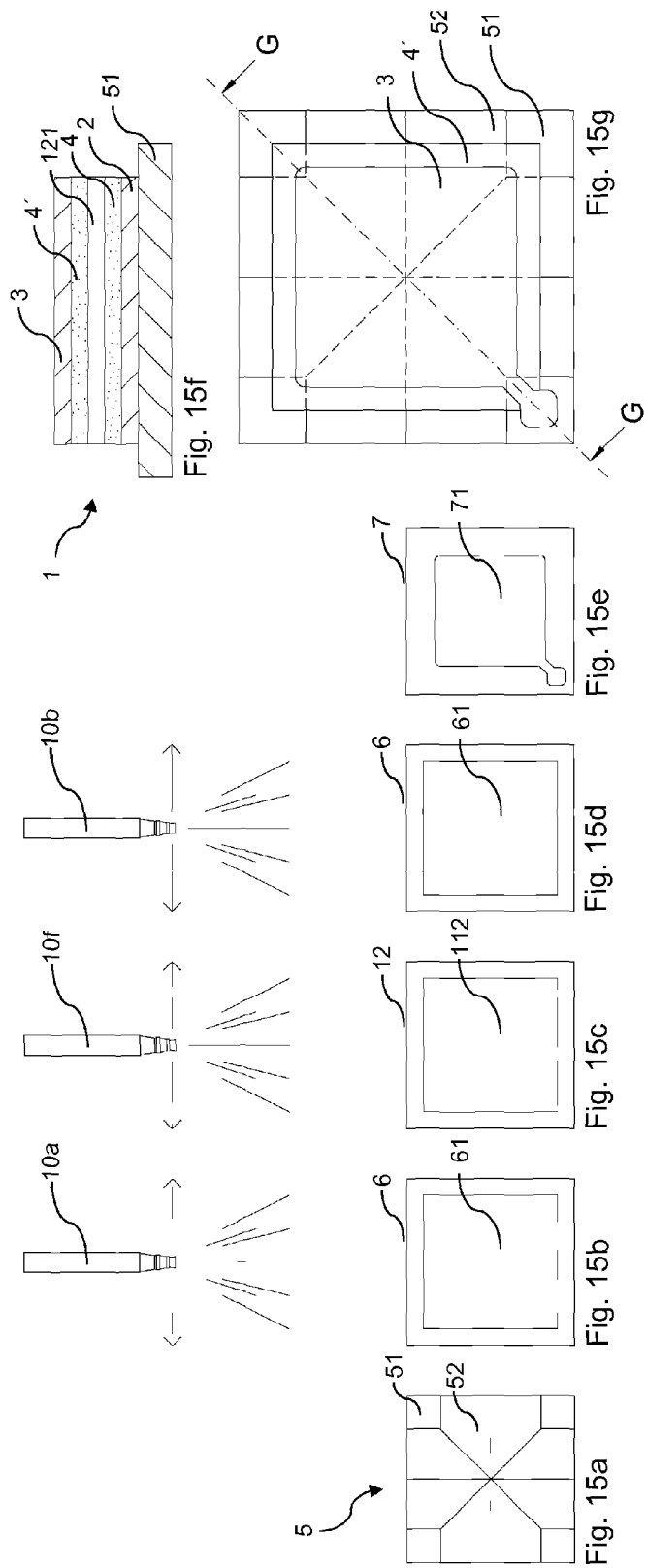

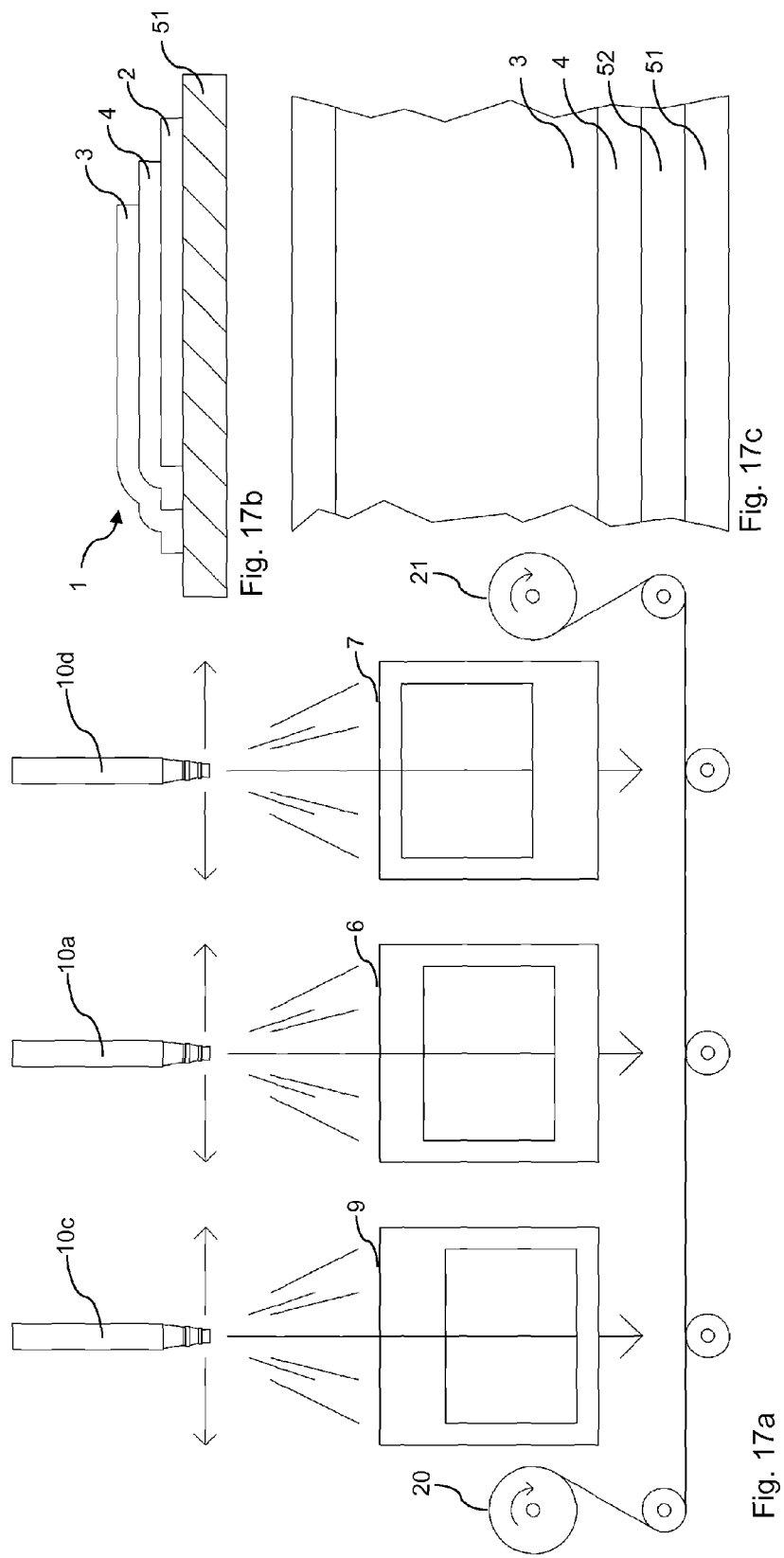

METHOD FOR MANUFACTURING A LIGHT-EMITTING ELECTROCHEMICAL CELL

CROSS-REFERENCE TO RELATED APPLICATIONS

This application is a U.S. national phase under the provisions of 35 U.S.C. §371 of International Patent Application No. PCT/EP13/73838 filed Nov. 14, 2013, which in turn claims priority of Swedish Patent Application No. 1251212-5 filed Oct. 26, 2012 and Swedish Patent Application No. 1251316-4 filed Nov. 21, 2012. The disclosures of such international patent application and both Swedish priority patent applications are hereby incorporated herein by reference in their respective entireties, for all purposes.

TECHNICAL FIELD

The present disclosure relates to a method for manufacturing a light-emitting electrochemical cell having an active material comprising mobile ions.

BACKGROUND

Organic light-emitting diodes (OLEDs) are drawing a lot of attention as light sources, since they offer several attractive and/or unique form-factor and aesthetic advantages from a user perspective, notably direct and soft areal emission from extremely thin, and sometimes conformable, devices. Moreover, the emission color of OLEDs depends on the chemical structure of the constituent organic light-emission material, which has opened the door for a large variety of emission colors, including white, via designed chemical synthesis of the organic light-emission material.

OLEDs are currently commercially available as small-sized displays in various high-end portable applications, notably cell phones and digital cameras. There are, however, other significant and emerging applications areas, such as solid-state illumination, low-cost displays and signage, where OLEDs or alternative areal light-emission technologies could become of interest, provided that current issues with scale-up and/or cost of production can be resolved.

OLEDs are fabricated in a sandwich structure, where one, or more frequently several, organic layers are sandwiched between an electron-injecting cathode and a hole-injecting anode (VanSlyke et al. in U.S. Pat. No. 4,539,507 and Friend et al. in U.S. Pat. No. 5,247,190). When a voltage is applied between the two electrodes, electrons and holes are injected into the organic layers; these electrons and holes can subsequently recombine in an organic light-emitting layer under the generation of light. In order for the generated light to escape out of the sandwich structure, at least one of the electrodes needs to be transparent or partially transparent.

For an OLED to be efficient in transforming electric power to light emission, it is critical that the cathode/electron-injection layer exhibits a low work function (defined as the minimum energy needed to remove an electron from a solid to a point immediately outside the solid surface) (Braun et al. in U.S. Pat. No. 5,408,109). Materials with sufficiently low work function for efficient electron injection in OLEDs are unfortunately not stable under ambient oxygen and/or water, and must therefore be processed and handled under vacuum and/or inert-atmosphere conditions. Today, the cathode/electron-injection layer in OLEDs is commonly deposited by thermal evaporation under high-vacuum conditions (Reineke, S. et al. Nature, 2009, 459, 234).

For an OLED to feature a desired homogenous areal light emission, it is critical that the constituent organic layers exhibit a highly constant thickness over the entire device area. As the required thicknesses of the constituent layers in OLEDs for efficient emission are in the range of 1-100 nm, this implies that the precision in deposition of the organic layers must be very high, and that a surface roughness exceeding 10 nm rarely can be tolerated. A preferable way towards scale-up and significant lowering of production costs, which as mentioned above is anticipated to pave the way to new high-volume markets, constitutes the employment of so-called "solution-based" deposition methods; these utilize the fact that many organic compounds can be dissolved or dispersed in liquids and be processed as "inks". It is further highly preferable if the entire device fabrication can be executed under uninterrupted ambient conditions, to avoid time-consuming and costly entries/exits into/out of, e.g., vacuum chambers. Moreover, it is also preferable if the entire fabrication of all constituent layers (electrodes and organic layer(s)) can be executed in a continuous fashion, e.g. by using a roll-to-roll procedure. Examples of scalable solution-based deposition methods that fulfil these criteria include slot-die coating, gravure printing, and flexoprinting. The commercially available OLEDs as of today are fabricated using solely expensive vacuum processing, but attempts have been made to fabricate the active layer in OLEDs from inks, using primarily inkjet-printing (J. Bharathan et al. Applied Physics Letters, 1998, 21, 2660.) and spin-coating (C. Zhang, et al. Synthetic Metals, 1994, 62, 35.), but also spray-coating (Y. Aoki, et al. Thin Solid Films, 2009, 518, 493.).

However, it is notable that it is not to be expected that the entire fabrication of an OLED can be carried out under ambient conditions using solution-based deposition methods, due to the requirement of an air-reactive cathode/electron-injection layer. Moreover, high-throughput solution-based deposition techniques, such as slot-die and spray coating, typically produce layers with significant surface roughness, thus violating the OLED requirement of extremely thin and exact layers. Finally, the existence of small "dust" particles in a typical ambient atmosphere can result in severe problems with short circuits through the ~1-100-nm-thin films utilized in OLED devices. The light-emitting electrochemical cell (LEC) exhibits the same application advantages as the OLED, as specified in the first paragraph in this section, but features a distinctly different operational procedure due to the existence of mobile ions in the organic light-emitting layer. These mobile ions are commonly introduced into the device by blending the organic light-emitting material with an electrolyte (Pei et al. in U.S. Pat. No. 5,682,043). The mobile ions redistribute when a voltage is applied between the electrodes, and allow for the initiation of doping at the two electrode interfaces; p-type doping at the anode and n-type doping at the cathode. With time, these doped regions grow in size to make contact, so that a light-emitting p-n junction forms in the bulk of the active layer. The consequences of these in-situ doping and p-n junction formation processes are that LECs, in contrast to OLEDs, do not depend on the utilization of an air-reactive cathode/electron-injection layer and thin and exactly controlled organic layers for efficient operation. Instead, LECs can feature air-stabile and solution-processable electrodes and one thick and uneven layer as the light-emission (active) layer.

The major drawback with LECs compared to OLEDs has been a very short operational lifetime. However, recent progress in this field has resulted in that it is now possible to attain rather impressive operational lifetimes of several 1000 hours at a significant brightness of >100 cd/m$^2$ for LEC devices (A. Asadpoordarvish, et al. Applied Physics Letters, 2012, 100, 193508.). With this in mind, it is appropriate to focus on the development of low-cost and scalable production methods of LEC devices, preferably by using solution-based deposition methods carried out under ambient conditions in a manner compatible with high-volume roll-to-roll (R2R) production.

Most current LECs are still fabricated akin to how polymer-based OLEDs are made, namely with vacuum-processed electrodes sandwiching a thin spin-coated active layer. Recent inventions have, however, demonstrated that it is possible to fabricate the active layer in planar LECs with inkjet-printing (G. Mauthner, et al. Organic Electronics, 2008, 9, 164), and the top electrode and the active layer in sandwich-cell LECs with slot-die coating (A. Sandström, et al. Nature Communications, 2012, 3, 1002), screen printing (Victor et al. in U.S. Pat. No. 7,115,216), and doctor-blade coating (Matyba et al. in Swedish patent No. SE 534,257). A drawback with spin-coating is that a large majority of the (often expensive) active-material ink is wasted during the spinning. Spin-coating and inkjet printing are in addition not easily upscalable deposition techniques. An important drawback with slot-die coating, screen printing and doctor-blade coating is that the solvent commonly exhibits a slow evaporation time, which is particularly true when thick films insensitive to damage by, e.g., ambient dust particles are to be fabricated. The slow evaporation time has the following undesired consequences: (i) It is difficult to attain multilayer structures, as the solvent in the solution-under-deposition tends to dissolve the beneath (dry) layer. This problem can be alleviated/resolved via the employment of materials with orthogonal solubility, but such a procedure puts a severe restriction on the number of available material combinations in a multilayer geometry. (ii) The light-emitting material and the electrolyte in the active layer have ample time to phase separate and/or form concentration gradients on a macroscopic scale and/or crystallize during the slow solvent evaporation, with a typical undesired manifestation being a distinctly non-homogenous light emission area. Moreover, it is very difficult to attain 2D light-emission patterns, to attain multi-colored emission, and to coat uneven surfaces using slot-die coating. Finally, all of the above introduced solution-based deposition techniques require a high solute-concentration, which further restricts the number of available materials, as many electronically active organic compounds exhibit a low or intermediate solubility, particularly in industrially preferred solvents such as water. An additional problem with a high solute-concentration solution is that it, in contrast to a low-concentration solution, is difficult to purify from impurities in the form of micron-sized "dust" particles.

Thus, it is highly desirable to establish and develop a material-conservative deposition method for LEC fabrication that can be carried out under uninterrupted ambient conditions. The method should be easily upscalable, and allow for fabrication of thick and fault-tolerant LEC-active films that can generate homogenous light emission over large surfaces when sandwiched between two similarly deposited electrode materials, at least one of which is transparent. It is further desirable if the developed deposition method can allow for deposition of low-solubility organic compounds and/or low-concentration solutions, generate 2D single- and multi-colored emission patterns, and coat complex and non-flat surfaces.

The patents and articles described in this section disclose many materials that are useful in the present invention, and their disclosures are incorporated herein by reference.

SUMMARY

An object of the present disclosure is to provide an improved method of manufacturing a light-emitting electrochemical cell. A specific object is to provide a method which enables low cost, large scale production of light-emitting electrochemical cells of sufficient quality.

The invention is defined by the appended independent claims. Embodiments are set forth in the appended dependent claims, in the following description and in the drawings.

According to a first aspect, there is provided a method for manufacturing a light-emitting electrochemical cell comprising a first electrode, a second electrode, and a first light-emitting active material in electrical contact with and separating the first and second electrodes. The first active material comprises mobile ions. The method comprises a step of depositing the first active material by spray-coating at an ambient gas pressure of at least about 1 kPa.

By spray-coating is meant a coating which is sprayed through the air (or an ambient gas or gas mixture) onto a surface. The spraying may be made manually for example by using a spray gun or automatically by for example mounting an airbrush onto a computer controlled (CNC) robot. A liquid coating material mixes with the compressed gas stream (air or inert carrier gas, such as N$_2$) and is atomized, turned into aerosol, i.e. liquid droplets in a gas, and released as a fine spray, which is directed onto the surface to be coated. An alternative method may be the use of an ultrasonic vibrator. Also other spray-coating techniques are possible.

The spray particles may, but need not, be semi-dry when they impinge on a surface to be coated. Most of the solvent the particles were dissolved or dispersed in may have evaporated during the transfer from the airbrush to the substrate. In addition, the flow of carrier gas from the airbrush may also increase the rate of drying of deposited particles on the surface significantly. This has the important advantage that material exchange between different particles is minimized, as material exchange between a recently deposited semi-dry particle and a dry or semi-dry surface can be anticipated to be minimal. Moreover, by moving the airbrush laterally over the surface to be coated, this effect will be further corroborated, as the surface exhibits a longer drying time before being exposed to the deposition of a new particle.

Spray-coating deposition is anticipated to generate more rough and open-morphology films than e.g. spin-coating. This feature makes spray-coating particularly suitable for the manufacture of light-emitting electrochemical cells (LEC), where the requirements and control of film evenness and thickness is of less importance for the performance of the LEC compared to the performance of e.g. OLEDs. OLEDs require flat films for good performance, but such thickness variations are not an issue in LECs. An open morphology with significant free volume is expected to pave the way for faster response times, since bulky ions thereby have easier access to the light-emitter during the doping process.

Quite surprisingly, spray coating has been found to provide a LEC presenting more even light emission than other techniques. It is believed that this is due to the fact that the finely distributed spray droplets dries substantially during the transit from the spray nozzle to the substrate, or impinges on substantially dry material on the surface, and hence is less prone to fluid communication, thus creating a more homogenous material.

A gas pressure of "at least about 1 kPa" should at least be interpreted as including the boundary value 1 kPa.

The step of spray-coating may thus be performed such that spray droplets, when arriving at a surface being coated, are sufficiently wet to adhere to the surface, and sufficiently dry to substantially prevent fluid communication with adjacent droplets.

Hence, when viewing the coated surface in a microscope, original droplet boundaries may still be visible, indicating that adjacent droplets have not merged.

For example, the step of spray-coating may be performed such that the spray droplets impinge on a surface layer, with surface layer defined as the topmost 100 nm of material, with the surface comprising a liquid solvent and/or dispersion-agent mass fraction of below about 90%, below about 80%, below about 50%, below about 10%, below about 5% or below about 1%.

The step of depositing the first active material may be performed at an ambient gas pressure of at least about 5 kPa, at least about 10 kPa, at least about 50 kPa, at least about 100 kPa or at least about 101 kPa.

The step of depositing the first active material may be performed at an ambient gas pressure below about 1100 kPa, below about 500 kPa, below about 250 kPa, below about 150 kPa or below about 105 kPa.

The step of depositing the first active material may be performed at an ambient gas pressure between about 50 kPa and about 210 kPa.

In this embodiment the ambient gas pressure during the deposition step is a pressure which is not created by any specialized high-cost vacuum creating or pressurizing equipment. Since the spray-coating may take place at this ambient gas pressure, there is no need for time-consuming and expensive vacuum-processing steps for the deposition of the light-emitting active material layer.

Other steps of the method, such as the preparation of a surface onto which the light-emitting active material is deposited, drying of the deposited layer etc. may, however, take place in non-ambient air pressure conditions. Ideally, however, also pre- and/or post deposition steps may be performed at this ambient pressure interval.

The step of depositing the first active material may be performed at an ambient temperature of at least about 0° C., at least about 10° C., or at least about 15° C.

The step of depositing the first active material may be performed at an ambient temperature below about 50° C., below about 40° C., below about 30° C., or below about 25° C.

In one embodiment, the step of depositing the first active material may be performed at an ambient temperature between about 15° C. and about 25° C.

This ambient temperature is a temperature which need not be the result of any specific heating or cooling of the ambient temperature during the deposition step.

The step of depositing the first active material may be performed at an ambient oxygen concentration of at least 100 ppm, at least 0.1%, at least 1%, or at least 10%.

Other steps of the method, such as the preparation of a surface onto which the light-emitting active material is deposited, drying of the deposited layer etc. may, however, take place in non-ambient gas pressure, temperature or chemical conditions. Ideally and most practically, however, also pre- and/or post deposition steps are performed at this ambient gas, temperature and chemical interval.

The method may further comprise a step of depositing at least part of the first and/or second electrode by spray-coating at an ambient gas pressure of at least about 1 kPa.

Hence, all, or part of, the first and/or second electrode may be formed by spray coating.

In some embodiments all parts of the light-emitting electrochemical cell are spray-coated, including both the first and the second electrodes and the light-emitting active material.

In other embodiments other means for depositing the first and/or the second electrode may be used.

The method may further comprise a step of forming at least part of the first and/or second electrode from a substrate material and/or by deposition at a lower ambient gas pressure and/or a higher ambient temperature as compared to the step of depositing of the active material.

Hence, all or part of, the first and/or second electrode may be formed by a part of the substrate and/or by deposition by other means than spray coating, including any type of metal deposition technique, such as ion plating, ion implantation, sputtering, thermal evaporation, and chemical vapor deposition (CVD) type techniques. For solution processable materials, such as semi-conducting and conducting polymers, etc., various printing techniques, such as ink-jet printing, slot-die coating, screen printing, gravure printing, flexo-printing, coater bars, doctor-blade coating, may be utilized.

The method may further comprise a step of providing a contact-improving layer in contact with the first active material and one of the electrodes.

By providing a contact-improving layer, it is possible to improve the contact area and, in the case when metallic nanowires are used as second electrode material, to secure the wires to the surface. The contact-improving layer may be of the same material as the associated active material layer, but preferably thinner.

The method may further comprise a step of providing a conducting layer in contact with the first electrode, such that a bi-layer electrode structure is formed, comprising the conducting layer and the first electrode.

The method may further comprise a step of forming at least one layer of a second light-emitting active material overlapping at least a portion of the layer of first active material, by means of spray-coating at an ambient gas pressure of at least about 1 kPa.

The deposition of the second layer of light-emitting active material may be performed during substantially the same ambient conditions as the spray-coating of the active material.

In further steps, additional third, fourth, fifth, etc., active material layers may be provided analogously.

It is noted that all parameters relating to the first active material may, but need not, be applied to the second and further active materials.

An advantage with the spray-coating is that upon arrival of small spray drops to the surface to be coated, the underlying material may already be dry or semi-dry. Thereby, a subsequent layer of active material layer does not dissolve the previous layer of active material. Hence, sprayable solutions of similar solubility can easily be adapted for immediate or almost immediate subsequent deposition.

The second active material may differ substantially from the first active material with regard to color emitted.

Thereby multi-colored emission may be provided when compositions emitting different colors are used in the different layers. In the alternative, or as a complement, white light may be generated by a LEC comprising three or more different layers.

The method may also comprise a step of depositing at least one charge-creating layer between the first and second active material layers.

Hence, the individual LECs formed on top of each other can be controlled individually by applying a respective voltage bias over each device, It is also possible to drive the same current through all LECs by applying a voltage bias between the bottom and top electrode.

The method may further comprise a step of providing at least one triplet emitter in or adjacent to at least one layer of light-emitting active material, in an amount sufficient to provide an increase in device light generation efficiency.

Triplet emitters, such as organo-transition-metal compounds and quantum dots, are attractive for improving the efficiency of organic light emitting devices. This is a consequence of significantly higher efficiencies obtainable with these compounds as compared to organic-polymer emitters. It is well known that the polymers used in light emitting devices are singlet emitters, and as such only allow for a theoretical maximum quantum efficiency of 25%. Due to spin statistics, 75% of the excitons formed are triplets, which are lost as heat in singlet emitters. However, by adding guest emitters capable of triplet emission, these excitons can be emitted as light. Using spray processes, triplets can be easily added from solution or dispersions allowing a wide range of materials to be utilized. For multicolored devices, spraying also allows for strategic positioning of the triplets, as to not quench the emission from the singlet. Different colored triplets can be added on both sides of the pn-junction.

The triplet emitter may comprise quantum dots.

At least one triplet emitter may also be ionic and/or non-ionic organometallic complexes.

The depositing of the first and/or second electrode, second active material, contact-improving layer, conducting layer, triplet emitter by spray coating may be performed during substantially the same ambient conditions as the spray coating of the active material. Hence, the various ambient parameters mentioned above can be applied also to such steps.

The method may further comprise a step of applying a patterning mask, for forming a predetermined pattern, in connection with at least one of the deposition steps. For example, the patterning mask may be a shadow mask.

The method may further comprise at least one drying step.

One or more drying steps may be provided after deposition of the at least first and/or second electrode, after deposition of the anode, and/or after deposition of an active material. Since, upon arrival at the surface to be coated with light-emitting active and/or other materials, such as electrodes, the sprayable solution is semi-dry, the drying step is optional. The drying step may be accomplished by increasing the temperature, reducing ambient gas pressure and/or by the use of a gas stream (such as $N_2$) directed towards the layer to be dried.

The step of depositing an active material comprises a step of depositing an active material layer combined with an electrolyte, and a step of depositing an active material layer which is substantially free from electrolyte, such that the electrolyte-free active material layer contacts the electrolyte-combined active material layer.

With "substantially free" is meant that the active material contains an amount of electrolyte which is insufficient to provide any detectable effect.

The method may further comprise a step of encapsulating the light-emitting electrochemical cell.

Encapsulation may provide protection for the LEC and increase its lifetime and/or performance.

The employment of flexible encapsulation barriers may provide for the demonstration of flexible and conformable devices.

The method may further comprise providing a substrate in the form of a continuous web or on a continuous web carrier, unwinding at least part of the web or web carrier, and performing at least one deposition step while the substrate is in the form of the continuous web or on the continuous web carrier.

In the method, spraying parameters and ambient parameters may be selected such that in the resulting deposited material, droplet features of overlapping droplets are distinguishable.

That is, a boundary between a subsequently deposited droplet and a previously deposited droplet should, at a portion of the boundary where the droplets overlap, be distinguishable.

These parameters may be maintained throughout the spraying process.

According to a second aspect, there is provided a light-emitting electrochemical cell manufactured according to the method as claimed in any of the preceding claims.

The light-emitting electrochemical cell may provide a relative change in area-integrated light-emission intensity between more than 95%, or more than 99% or more than 99.9%, of neighboring 1×1 $mm^2$ areas of less than 20%, less than 10%, and less than 5%.

According to a third aspect, there is provided a light-emitting electrochemical cell comprising first and second electrodes; a first light-emitting active material in electrical contact with and separating the first and second electrodes; the first active material comprising mobile ions in an amount sufficient for doping the active material, wherein the cell provides a relative change in area-integrated light-emission intensity between more than 95%, or more than 99% or more than 99.9%, of neighboring 1×1 $mm^2$ areas of less than 20%, less than 10%, and less than 5%.

Hence, light-emitting electrochemical cells can be provided by spray coating the active material under substantially ambient conditions. In order to provide a light-emitting electrochemical cell having a homogenous light emission pattern, the spray coating parameters, such as active material type, solvent type, spray droplet size, droplet velocity, ambient pressure and temperature, substrate temperature and drying time between subsequently deposited droplets may be selected such that the droplets, when impinging on previously deposited droplets, are sufficiently wet to allow them to adhere to the previously deposited droplets, but sufficiently dry to substantially prevent fluid communication between droplets. Alternatively, the fluid communication between already-deposited droplets can be substantially prevented by allowing the droplets to impinge on a surface layer, with surface layer defined as the topmost 100 nm of material, with the surface comprising a liquid solvent and/or dispersion-agent mass fraction of below about 90%, below about 80%, below about 50%, below about 10%, below about 5% or below about 1%. By such a spray procedure, the risk of phase separation and/or concentration gradients and/or crystallization, which have been found to be a major factor for reducing light emission homogeneity, may be reduced.

A luminance meter may be used to measure average brightness from an electrochemical cell. Typically, the electrochemical cell is divided into a plurality of neighboring 1×1 mm² areas. The difference in average brightness between neighboring areas may be used to quantify the light emission homogeneity. A small change in area-integrated light-emission intensity between neighboring areas indicate a high spatial homogeneity.

In the deposited material above, droplet features may be distinguishable.

Droplet features, such as generally circular contours (rings or partial rings) or protrusions, may be visible in sufficient magnification and through e.g. the methods referred to herein.

BRIEF DESCRIPTION OF THE DRAWINGS

The appended drawings contain, in addition to the schematic drawings and graphs illustrating the production of the light-emitting electrochemical cell, photos taken while testing the various embodiments. These photos are intended merely to illustrate the fact that light was actually generated by the respective device and that fluid communication between neighboring spray droplets is substantially prevented.

It should also be noted that, for clarity, not all steps are shown in all drawings.

FIGS. 3a-3f schematically illustrate structures used or obtained during the process of manufacturing a second embodiment of a light-emitting device.

FIGS. 8a-8e schematically illustrate structures used or obtained during the process of manufacturing a fourth and fifth embodiment, respectively, of a light-emitting device.

FIGS. 15a-15g schematically illustrate structures used or obtained during the process of manufacturing a ninth embodiment of a light-emitting device.

FIGS. 17a-17c schematically illustrate a production concept for mass production of a light-emitting device.

DESCRIPTION OF EMBODIMENTS

Figures 1A, 1B, 1C:
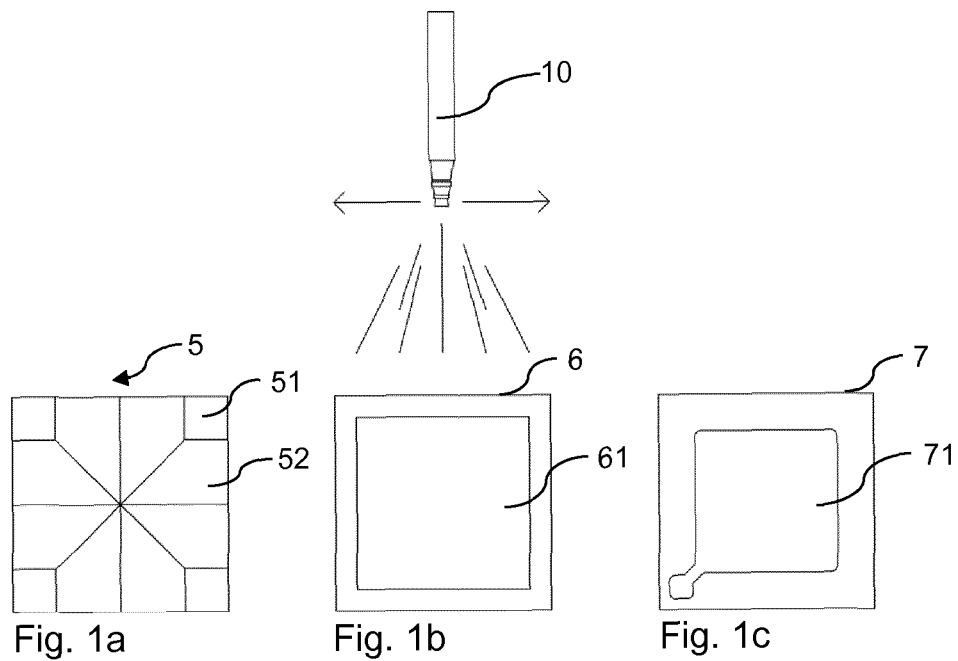
FIGS. 1a-1e schematically illustrate structures used or obtained during the process of manufacturing a first embodiment of a light-emitting device.

The concept disclosed herein will now be explained in more detail. Initially, various production steps and resulting structures will be explained in general terms. Subsequently, a number of examples of device concepts and their respective production methods will be described in more detail.

In the following disclosure the possibility of using spray-coating at ambient conditions for the manufacturing of light-emitting electrochemical cells having mobile ions in the organic light-emitting layer, "LECs", is shown.

The LEC 1 comprises a first electrode 2, a second electrode 3, and a light-emitting active material 4 in electrical contact with and separating the first and second electrodes 2, 3. The mobile ions of the light-emitting active material layer 4 are commonly introduced into the device by blending the organic light-emitting material with an electrolyte. The mobile ions redistribute when a voltage is applied between the electrodes 2, 3 and allow for the initiation of doping at the two electrode 2, 3 interfaces; p-type doping at the anode and n-type doping at the cathode. With time, these doped regions grow in size to make contact, so that a light-emitting p-n junction forms in the bulk of the active layer 4.

The consequences of these in-situ doping and p-n junction formation processes are that LECs 1, in contrast to organic light-emitting diodes (OLEDs), do not depend on the utilization of an air-reactive cathode/electron-injection layer and thin and exactly controlled organic layers for efficient operation. Instead, LECs can feature air-stabile and solution-processable electrodes 2, 3 and a thick and uneven layer as the light-emission (active) layer 4.

Thereby, manufacturing of the LECs 1 may be performed during ambient pressure and/or ambient temperature and/or ambient oxygen conditions. This means that time-consuming and costly entries/exits into/out of, e.g., vacuum chambers can be avoided during the manufacturing of LECs 1.

By spray-coating is here meant a coating which is sprayed through the air onto a surface using a spraying device 10. The spraying may be made manually for example by using and moving a spray gun or automatically by for example mounting an airbrush onto a computer controlled (CNC) robot. A liquid coating material mixes with the compressed gas stream (air or inert carrier gas such as $N_2$) and is atomized, turned into aerosol, i.e. liquid droplets in a gas, and released in a fine spray, which is directed onto the surface to be coated. An alternative method may be the use of an ultrasonic vibrator. Also other spray-coating techniques are possible.

The spray particles may, but need not be semi-dry when they impinge on the surface to be coated. (As most of the solvent the particles were dissolved or dispersed in may have evaporated during the transfer from the airbrush to the substrate and as the constant flow of carrier gas from the airbrush also increases the rate of drying.) Thereby, the sprayed particles exhibit a relatively minor mechanical strain/impact when they impinge softly on the surface to be coated.

The sprayable ink comprises the material-to-be deposited as a solution or dispersion; the solvent in both cases may be one-component or multi-component.

Substrate

In a first step, a substrate 5 is provided onto which the LEC 1 is formed.

The substrate material may be optically transparent or semi-transparent.

The substrate 5 may comprise polymeric material, which may be selected from a group consisting of poly(ethylene terephthalate), poly(ethylene naphthalate), poly(imide), poly (carbonate), or combinations or derivatives thereof. Such substrates 5 may comprise at least 50% by weight polymeric material.

The polymeric material may present a maximum modulus of elasticity of about 0.01-10 GPa, preferably 0.8-3.5 GPa. In addition, polymer substrates may be characterized as having an elongation at fracture on the order of 0.0008-5%.

As another option, the substrate 5 may comprise electrically conductive material or exhibit at least an electrically conductive portion. Such substrates 5 may comprise at least 50% by weight electrically conductive material.

The electrically conductive material or portion may be metallic, such as aluminum, stainless steel or silver.

The electrically conductive material may present a maximum modulus of elasticity of about 13-400 GPa, preferably 60-220 GPa. An elongation at fracture may be on the order of 0.0005-0.9%.

As yet another option, the substrate 5 may comprise glass, glass-like material, ceramic material or semiconductor wafer material. Such substrates may have an elongation at fracture on the order of 0.0004-0.0005%.

The glass, glass-like material, ceramic material or semiconductor wafer material may present a maximum modulus of elasticity of about 50-90 GPa.

The substrate may 5 comprise at least 50% by weight glass, glass-like material, ceramic material or semiconductor wafer material.

As yet another option, the substrate may comprise at least 50% by weight of a paper or paper-like material.

Another option is that the substrate 5 may comprise at least 50% by weight of a web material, such as a woven or non-woven material.

The methods disclosed herein allow for substrates having a variety of shapes. For example, the substrate 5 may present a substantially planar portion. As an alternative or complement, the substrate 5, may present a substantially curved portion.

The substrate 5 may present two or more substantially curved portions, such as concave or convex portions and such portions may be single curved or double curved.

In cases where the substrate is non-conducting, it is possible to provide conducting portions or layers coated onto, or embedded in, the conducting material.

A substrate 5 itself may act as an integral part of the first electrode 2. This helps alleviate resistive losses in the electrode 2, and improves the cooling of the device 1 as the heat is more effectively transported away from the light emitting junction compared to when insulating or non-conducting substrates, such as glass substrates, are employed.

First Electrode

As mentioned, a non-conducting substrate may be coated with a thin film of electrical conductive material, forming the first electrode 2 or part of the first electrode 2. Various depositing techniques may be used for this coating, such as electron beam evaporation, physical vapor deposition, sputter deposition techniques, etc. For solution processable materials, such as conducting polymers etc., various printing and coating techniques may be utilized.

The electrical conductive material may be optically transparent or at least semi-transparent.

The first electrode 2 may be patterned.

The transparent or partially transparent electrical conductive material may be selected from a group consisting of: graphene, graphene oxide, carbon nanotubes, thin metal films, metal meshes, metallic nanowires, a doped transparent conductive oxide (TCO), and transparent or partially transparent conducting polymers (TCP).

The metallic nanowires may be selected from a group consisting of any conductive material or blend thereof, such as Ag, Cu, Ni, and CuNi.

The doped transparent conductive oxide (TCO) may be selected from a group consisting of $SnO_2$, $In_2O_3$, ZnO, CdO, $Sb_2O_3$, and mixtures thereof. Specific, non-limiting examples include indium tin oxide, fluorine tin oxide, Al zinc oxide, indium cadmium oxide, gallium zinc oxide, and indium zinc oxide.

The transparent or semi-transparent conducting polymer (TCP) may be selected from a group consisting of polythiophenes, polypyrroles, polyanilines, polyisothiana phthalenes, polyfluorenes, polyphenylene vinylenes and copolymers thereof. Specific, non-limiting examples include Poly (3,4-ethylenedioxythiophene)-poly(styrenesulfonate) (PEDOT-PSS), PEDOT tosylate and/or other transparent or partially transparent conducting polymers, and/or blends thereof.

The first electrode 2 may be formed as a bilayer electrode comprising two electrically conducting materials on top of each other on a substrate material 5, such as for example a metallic nanowire layer coated with a transparent or semi-transparent layer of conducting polymer. A bilayer electrode 2 may also, for example, be formed from an electrically conducting substrate 5 coated with a layer of transparent or semi-transparent conducting polymer.

In one embodiment, at least a portion of the first electrode 2 may be deposited onto the substrate material 5 by means of spray-coating. In the case with bilayer electrodes, both layers may be deposited by spray-coating or, alternatively, only one of the layers may be deposited by spray-coating.

The sprayable ink comprises the material-to-be deposited as a solution or dispersion. The solvent in both cases may be one-component or multi-component, and may comprise liquids such as water, isopropanol, ethanol, cyclohexanone, and ethylene glycol.

In one specific example, a bilayer electrode is formed on a glass substrate by means of spray-coating with a first layer of silver nanowires and with a subsequent layer of PEDOT-PSS.

Second Electrode

The second electrode 3 may be deposited using conventional depositing techniques such as the ones mentioned above for the deposition of the first electrode 2.

Alternatively, the second electrode 3 may be deposited by means of spray-coating in a similar way to what has already been discussed for the spray-coating of the first electrode 2.

In some embodiments, at least part of both the first and the second electrodes are deposited by means of spray-coating. In other embodiments only one of the first and second electrodes are deposited by means of spray-coating. In an alternative embodiment no part of the first and second electrodes are deposited by means of spray-coating.

Active Material

The light-emitting active material layer 4 may be deposited by means of spray-coating at an ambient pressure of at least about 1 kPa.

A sprayable solution comprising at least one light-emitting material and at least one electrolyte may be used in the spray-coating of the light-emitting active material 4.

In an alternative embodiment, the at least one light-emitting material and the at least one electrolyte are in separate sprayable solutions, which are sprayed so as to substantially simultaneously reach the substantially same area to be coated.

An advantage with the alternative embodiment is that there is no need for solvents or solvent systems that are capable of dissolving both the electrolyte and the conjugated polymer, which could be an issue when using a hydrophobic light-emitting molecule and a hydrophilic electrolyte or vice versa.

In yet an alternative embodiment, a sprayable active material solution does not comprise any electrolyte, so as to form an active material layer without electrolyte. For further details, see embodiment 9.

By sprayable solution is here meant a solution and/or dispersion of the active material components in a solvent or solvent mixture comprising liquids, such as water, toluene, cyclohexanone, and tetrahydrofuran.

The at least one electrolyte may be selected from a group consisting of: a gel electrolyte, a substantially solid electrolyte, a substantially liquid electrolyte, a salt comprising electrolyte, an electrolyte comprising an ion-dissolving material, an electrolyte comprising an ionic liquid, an electrolyte comprising an ion-dissolving material, or combinations thereof.

The salt comprising electrolyte may comprise at least one metal salt, said salt comprising a cation, such as Li, Na, K, Rb, Mg, or Ag, and a molecular anion, such as $CF_3SO_3$, $ClO_4$, or $(CF_3SO_2)_2N$.

The electrolyte comprising an ion-dissolving material may comprise at least one polymer material, which is selected from a group consisting of poly(ethylene oxide), poly(ethylene glycol) (PEG), poly(propylene oxide), methoxyethoxy-ethoxy substituted polyphosphazane, and polyether based polyurethane, or combinations thereof.

The ion-dissolving material may have functionalized end groups. One example of such an end group is dimethacrylate (DMA).

In one embodiment the electrolyte comprises $KCF_3SO_3$ dissolved in PEG-DMA.

The at least one light-emitting material may be selected from a group consisting of: a single-component ionic light-emitting material, an ionic conjugated polymer, or a combination thereof.

The single-component ionic light-emitting material may be $Ru(bpy)_3^{2+}(X^-)_2$, where bpy is 2,2'-bipyridine and $X^-$ typically is a molecular anions such as $ClO_4^-$ or $PF_6^-$.

The ionic conjugated polymer may be cationic polyfluorene, or alternatively a mixture of such a substance with an electrolyte.

The at least one light-emitting material may be selected from a group consisting of: a neutral light-emitting molecule, and a light-emitting polymer.

The neutral light-emitting molecule may for example be rubrene,

The light-emitting polymer may be a conjugated polymer selected from the group consisting of poly(para-phenylene vinylene) (PPV), polyfluorenylene (PF), poly(1,4-phenylene) (PP), polythiophene (PT), and neutral and ionic derivatives thereof, and any type of co-polymer structure thereof.

In one embodiment, the conjugated polymer may be a phenyl-substituted PPV copolymer, such as superyellow, poly[2-methoxy-5-(2-ethyl-hexyloxy)-1,4-phenylenevinylene] (MEH-PPV), and a polyspirobifluorene-based copolymer, such as "superblue" (SB, Merck, SPB-02T).

Contact-Improving Layer

In one step of the method a layer of the light-emitting active material may be spray-coated onto the second electrode 3.

Thereby the contact area is improved and the second electrode 3 material may also be secured to the underlying surface.

Further Active Material Layers

In a subsequent depositing step a second layer of light-emitting active material may be deposited overlapping at least a portion of the first layer of light-emitting active material 4, forming a bilayered structure.

In one embodiment, at least three, at least four, at least five or at least six layers of light-emitting active material are spray-coated on top of each other, forming multilayer structures.

Upon arrival on the surface to be coated with the light-emitting active material 4, the spray droplets are semi-dry and/or the surface to be coated is semi-dry or dry. Thereby, a second layer of light-emitting active material layer 4 does not dissolve a first layer of light-emitting active material 4' already deposited. Also, sprayable solutions of similar solubility are thereby possible to deposit on top of each other.

In one embodiment the second active material 4 differs substantially from the first active material 4' with regard to color emitted. Thereby multi-colored emission may be provided when compositions emitting different colors are used in the different layers 4, 41, 42. In the alternative, or as a complement, white light may be generated by a light-emitting electrochemical cell 1 comprising three or more layers of active material 4, 41, 42.

Charge-Creating Layer

A charge-creating layer may be deposited between a first and second layer of active material. Hence, the individual LECs formed on top of each other may be individually controlled by applying a respective voltage bias over each device. Alternatively, the same current is driven through all LECs by applying a respective bias between the bottom and top electrodes 2, 3.

In one embodiment such a charge-creating layer is comprised of a metal nanowire and a conjugated polymer, such as Ag-NW/PEDOT:PSS.

Hence, the disclosure above relating to the first and/or second electrodes is equally applicable to such a charge creating layer.

Triplet Emitters

The method may also comprise a step of providing at least one triplet emitter in or adjacent to at least one layer of light-emitting active material 4, in an amount sufficient to provide an increase in device light generation efficiency.

Triplet emitters in the form of ionic and non-ionic organo-transition-metal complexes and quantum dots are attractive for optimizations of organic light emitting devices. This is a consequence of significantly higher efficiencies obtainable with these compounds as compared to light-emitting polymers. It is well known that the polymers used in light emitting devices are singlet emitters, and as such only allow for a theoretical maximum quantum efficiency of 25%. Due to spin statistics, 75% of the excitons formed are triplets that are lost as heat in singlet emitters. However, by adding guest emitters capable of triplet emission, these excitons can be emitted as light. Using spray processes, triplets can be easily added from solution or dispersions allowing for a wide range of materials to be utilized. For multicolored devices, spraying also allows for strategic positioning of the triplets, as to not quench the emission from the singlet. Different colored triplets can be added on both sides of the pn-junction.

In one embodiment the triplet emitter comprises quantum dots. Quantum dots may be placed close to the transparent electrode and no quantum dots in the centre to facilitate energy transfer and triplet emission.

Other examples of triplet emitters are ionic and non-ionic organometallic complexes.

Mask

The method may further comprise at least one step of applying a patterning mask 6, 7, 9, 11 for forming a predetermined pattern, in connection with at least one of the deposition steps.

By the use of patterning masks 2D emission patterns may easily be produced, as is shown in embodiment 2.

The patterning mask may be a shadow mask 6, 7, 9, 11 or any other kind of suitable masks.

Ambient Conditions

All spray-coating deposition steps discussed above, i.e. the spray coating of the light-emitting active material 4, of at least portions of the first and second electrodes 2, 3, of further active material layers, of charge-creating layers and of triplet emitters may be performed at ambient conditions.

The spray-coating may be performed at an ambient gas pressure of at least about 5 kPa, at least about 10 kPa, at least about 20 kPa, at least about 30 kPa, at least about 40 kPa, at least about 50 kPa, at least about 60 kPa, at least about 70 kPa, at least about 80 kPa, at least about 90 kPa, at least about 100 kPa or at least about 110 kPa.

The depositing step may be performed at an ambient gas pressure below about 1100 kPa, below about 1000 kPa, below about 900 kPa, below about 800 kPa, below about 700 kPa, below about 600 kPa, below about 500 kPa, below about 400 kPa, below about 300 kPa, below about 250 kPa, below about 200 kPa or below about 150 kPa or below about 105 kPa.

In one embodiment the depositing step is performed at an ambient gas pressure between about 50 kPa and about 210 kPa.

In this embodiment the ambient gas pressure during the deposition step is a pressure which is not created by any specialized high-cost vacuum creating or pressurizing equipment. Since the spray-coating may take place at this ambient gas pressure there is no need for time-consuming and expensive vacuum-processing steps for the deposition of the light-emitting active material layer.

The depositing step may be performed at an ambient temperature of at least about 0° C., at least about 10° C., or at least about 15° C.

The depositing step may be performed at an ambient temperature below about 50° C., below about 40° C., below about 30° C., or below about 25° C.

In one embodiment, the depositing step may be performed at an ambient temperature between about 15° C. and about 25° C.

This ambient temperature is a temperature which is not the result of any specific heating or cooling of the ambient temperature during the deposition step. Other steps of the method such as the preparation of a surface onto which the light-emitting active material is deposited, drying of the deposited layer etc. may, however, take place in non-ambient temperature conditions.

The depositing step may be performed at an ambient oxygen concentration of at least 100 ppm, at least 0.1%, at least 1%, or at least 10%.

Spray Coating

In addition to the ambient parameters, such as pressure and temperature, gas composition (in particular with respect to the relevant solvent(s)), selection of solvent and coating material, droplet velocity, distance between air-brush and substrate, and the relative horizontal motion of the airbrush with respect to the substrate, are the parameters for the spray coating.

When spray coating, it is desirable to achieve a coating, wherein the droplets are sufficiently wet to adhere to each other to form the layer, but yet sufficiently dry to minimize fluid communication between the individual droplets when they have reached the substrate, as this will counteract undesired phase separation and/or crystallization and/or establishment of concentration gradients. It has been noted that a satisfactory result is achievable when the mixture and other conditions is such that the droplets exhibit no visible running effect when sprayed onto a substrate surface that is held substantially vertically.

One measure of this process may be the mass fraction of liquid solvent and/or dispersion agent present in the film immediately upon conclusion of the spray-coating. Preferably, this liquid solvent and/or dispersion-agent mass fraction should be below about 90%, below about 80%, below about 50%, below about 10%, below about 5% or below about 1%.

Hence, the subsequently dried surface thus formed may present a certain roughness rather than being smooth. Surface roughness can be measured by e.g. confocal laser scanning microscope or atomic force microscopy or surface profilometry (see e.g. FIGS. 19b, 19c, 19e, 19f where a surface roughness of ~0.5 µm is demonstrated using surface profilometry). Preferred surface roughnesses should be more than 10 nm, more than 50 nm, more than 80 nm, more than 100 nm, more than 150 nm, more than 200 nm, more than 300 nm, more than 500 nm, more than 1000 nm, more than 5 µm, more than 10 µm, more than 50 µm, more than 100 µm, more than 200 µm or more than 500 µm.

Droplet size (often termed "droplet diameter") may be about 10-300 µm, and preferably about 10-70 µm on forming at the nozzle and about 50-99% by weight of the solvent(s) may evaporate during droplet flight.

The parameters discussed above with respect to ambient conditions and spray coating apply to the active material(s) and to any electrode material(s).

Drying

The method may further comprise at least one drying step.

One or more drying steps may be provided after deposition the first and/or second electrode 2, 3, and/or after deposition of the active material. Since upon arrival at the surface to be coated with light-emitting active material 4, the sprayable solution can be semi-dry, the drying step may be optional. The drying step may be accomplished by increasing the temperature and/or by the use of a gas stream (such as $N_2$) directed towards the layer to be dried and/or by lowering the pressure.

The drying step may take place at an elevated temperature of at least 300° C., at least 250° C., at least 200° C., at least 150° C., at least 100° C., at least 50° C. at least 30° C. or at least 25° C.

The drying step may take place during a period which is less than 24 hours, less than 12 hours, less than 8 hours, less than 5 hours, less than 4 hours, less than 3 hours, less than 2 hours, less than 1 hour, less than 30 minutes, less than 15 minutes, less than 10 minutes, less than 5 minutes or less than 1 minute.

Encapsulation

The method may further comprise a step of encapsulating the light-emitting electrochemical cell. Encapsulation may provide protection for the device and increase its lifetime and/or performance.

Suitable materials for encapsulation include glass, metal foils, and flexible films, preferably allowing for oxygen and water transmission rates below $10^{-3}$ g/m$^2$*day.

R2R

The method may further comprise a production concept for mass production of LECs. The substrate in the form of a continuous web or on a continuous web carrier is supplied. At least part of the web or web carrier is unwound, and at least one of the above discussed deposition steps is performed while the substrate 5 is in the form of the continuous web or on the continuous web carrier.

See embodiment 10 for further details.

Testing of Resulting Device

The method may further comprise a characterization step to quantify the attained spatial homogeneity of the light emission. The device was divided into a grid system, with each grid point encompassing an area of 1×1 mm$^2$. A luminance meter (Konica Minolta LS-110) was employed to measure the average brightness from each such 1×1 mm$^2$ area, and the difference in average brightness between neighboring areas was used to quantify the light emission homogeneity. A small difference indicated a high spatial homogeneity, while a large difference indicated a poor spatial homogeneity.

Embodiment 1

Spray Coated Active Layer

To attain homogeneous large-area light-emission from a light-emitting device fabricated from solution under ambient conditions is a notably difficult achievement. This challenge stems from that: (i) thin solution-processed active-layer films used in OLEDs are detrimentally affected by dust particles (existing in the ambient or introduced during ink formulation) and small variations in film thickness, leading to problems with short-circuits and non-homogenous light-emission, respectively; (ii) thick solution-processed active-layer films, often based on blends of different solid materials, used in LECs tend to exhibit phase separation and/or concentration gradients and/or crystallization in the dry film after the solvent has evaporated; all the latter phenomena typically concomitant with non-homogenous light-emission. The above specified shortcomings of thick films can be attributed to the long solvent-evaporation time that is an outcome of, e.g., slot-die coating and screen printing. In this embodiment, we show that an appropriately executed spray-coating of thick films for application in LECs allow for the realization of homogenous bright emission from large-area light-emitting devices.

Figure 1D:
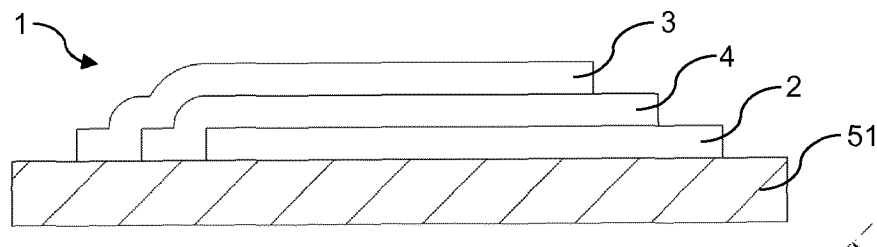
Figure 1E:
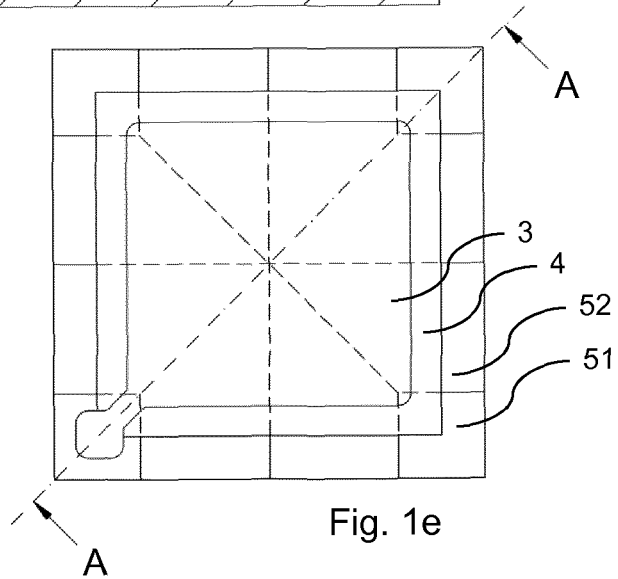
Figure 2A:
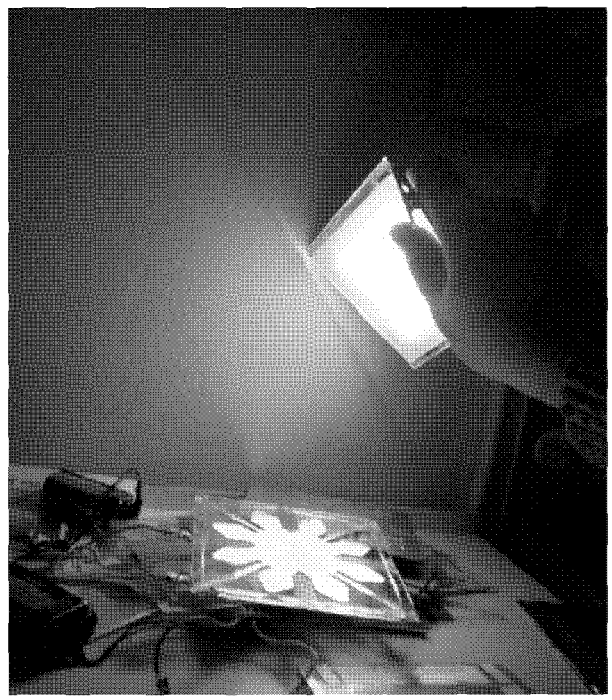
FIGS. 2a-2b are photos illustrating the fact that light (white portions) was generated by a light-emitting device according to the first embodiment.
Figure 2B:
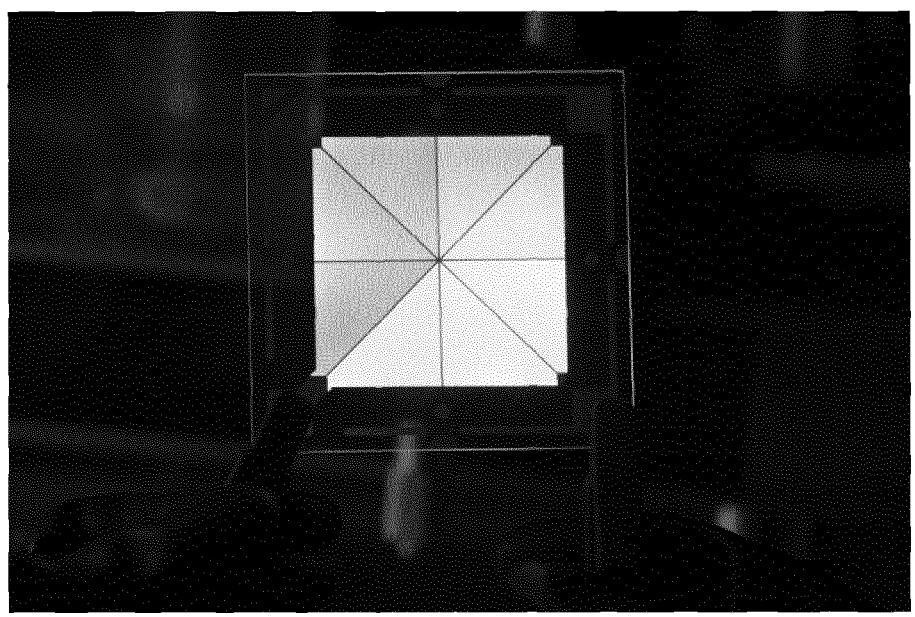

Schematic illustration of the fabrication and structure of, and photographs of the light-emission from, an 8-segment large-area LEC device 1 with a spray-coated active layer 4 are shown in FIGS. 1a-1e and in FIGS. 2a, 2b. Consecutive fabrication steps are shown in FIG. 1a being a pre-patterned ITO-coated 52 substrate 51, FIG. 1b the spray-coating of the active layer 4 by means of spray device 10, and FIG. 1c the pattern of the Al top electrode 3. FIG. 1d is a cross-sectional view, and FIG. 1e a top view, of the device structure, having an Al cathode 3, an active layer 4, a patterned ITO anode 2, and a substrate 51. Light-emission from an encapsulated large-area device driven at 23 mA/cm$^2$ under ambient air is shown in FIG. 2a and a large-area device driven at 3 V is shown in FIG. 2b; the latter photograph highlights the highly uniform light emission. The light emission in the two photographs in FIGS. 2a, 2b was attained from all 8 segments, featuring a total light-emission area of 44 cm$^2$.

FIGS. 1a-1e and FIGS. 2a, 2b display the fabrication and structure of, and light emission from, a LEC device 1 comprising eight 5.5 cm$^2$ segments, with the light-emitting active layer 4 spray-coated under ambient conditions. The active-layer 4 consists of the light-emitting conjugated co-polymer superyellow (SY, Merck, PDY-132), the ion-dissolving and ion-transporting compound poly(ethylene glycol)dimethacrylate (PEG-DMA), and the salt potassium trifluoromethane sulfonate (KTf). SY was dissolved in toluene, PEG-DMA in tetrahydrofuran (THF), and KTf in cyclohexanone; all master solutions were prepared in a concentration of 10 mg/ml. The active-layer ink was prepared by first blending the master solutions in a (SY:PEG-DMA:KTf) mass ratio of (1:0.5:0.1), and then adding 1.75 ml of THF and 0.25 ml of cyclohexanone to 2 ml of the blend solution.

The active-layer ink was sprayed through a simple rectangular shadow mask 6, 61 onto a pre-patterned indium-tin-oxide (ITO) 52 coated glass substrate 51 (FIGS. 1a, 1b). The active layer film 4 was dried at 70° C. in a nitrogen-filled glove box ([$O_2$]<1 ppm, [$H_2O$]<3 ppm) for 4 h, where after an Al top electrode 3 (100 nm thickness) was thermally evaporated through a shadow mask 7, 71 on top of the active layer film 4 (FIG. 1c). All device materials are air-stabile in the idle state, but during light-emission the active material 4 is sensitive to ambient oxygen and water. In order to allow for ambient operation and light emission, the device 1 was encapsulated with an Al plate (not shown), using a heat-curable resin as the adhesive between the Al plate and the device.

FIG. 2a displays the bright light emission from all 8 segments of such a large-area device 1 when driven with a current density of 23 mA/cm$^2$ under ambient conditions; the Al electrode 3 was biased as the negative cathode. FIG. 2b demonstrates the homogeneous emission from all eight segments of such a large-area device 1, featuring a total light-emission area of 44 cm$^2$.

Hence, according to this first embodiment, there is provided a method for producing a light-emitting electrochemical cell, comprising the steps of:

providing a non-conducting substrate, pre-provided with a patterned, transparent, electrically conducting surface layer, which is to provide an electrode layer;

optionally depositing by spray-coating in ambient conditions, an additional conducting layer onto the first electrode layer, making it a bi-layer electrode;

depositing, by spray coating in ambient conditions, an active material layer onto the first electrode layer, or bilayer, as the case may be; and depositing, optionally by spray coating in ambient conditions, a second electrode layer onto the active material layer.

Embodiment 2

Figure 4:
FIG. 4 is a photo illustrating the fact that light was generated by a light-emitting device according to the second embodiment.

Large-Area Light-Emitting Device with 2D Bi-Color Emission Pattern Effectuated by Sequential Spray Coating FIGS. 3a-3f and FIG. 4 show the fabrication, structure and patterned two-colored light-emission from a large-area device 1, comprising a bi-layer active material 4, 4' fabricated by sequential spray-coating of two different inks based on the same solvent with spray device 10a, 10b. The consecutive fabrication steps are shown in FIGS. 3a-3d. FIG. 3a shows the pre-patterned ITO-coated 52 substrate 51. FIG. 3b shows the spray-coating of the first active-layer 4' through a patterned shadow mask 8, 81 using ink 1. The spray-coating of a second active-layer 4 using ink 2 is shown in FIG. 3c, which is based on a different light-emitting polymer but the same solvent mixture as ink 1. In FIG. 3d the pattern of the Al top electrode 3 is shown. FIG. 3e is a cross-sectional view, and FIG. 3f a top view, of the device 1 structure, with an Al cathode 3, a second active layer 4, a patterned ITO anode 2, a substrate 51, and a patterned active layer 4, 4'. In FIG. 4 light emission from three of the 5.5 cm² segments in an 8-segment device biased at 5 V is shown.

The solvent-based fabrication of a multi-layered device structure 1 utilizing the same/similar solvent (mixtures) for neighboring/all layers in the device stack is a challenging task, since the solvent in the solution-under-deposition tends to dissolve the (dry) layer beneath. This problem can, however, be readily resolved using spray coating as disclosed in this embodiment. The solutions provided include making the spray particles semi-dry or dry when they interact on the beneath dry or semi-dry layer, allowing the carrier gas to function as an effective drying medium (both during the transfer of spray particles and during the flow over a spray-deposited film), and making sure that the spray particles exhibit a relatively minor mechanical strain/impact when they impinge softly on the dry layer beneath.

FIGS. 3a-3f display the fabrication and structure of a LEC 1, and FIG. 4 shows the patterned two-color light emission from, a LEC device 1 comprising eight 5.5 cm² segments, with the bi-layer light-emitting active layer 4, 4' spray-coated by means of spray device 10a, 10b under ambient conditions. The fabrication process is distinguished from embodiment one in FIGS. 1a-1e, FIGS. 2a, 2b in that an additional patterned active layer 4' was spray-coated before the non-patterned second active layer 4.

The active-layers 4, 4' consist of the yellow-emitting co-polymer SY, the blue-emitting polyspirobifluorene-based copolymer "superblue" (SB, Merck, SPB-02T), the ion-dissolving and ion-transporting compound PEG-DMA, and the salt KTf. SY and SB were separately dissolved in toluene, PEG-DMA in THF, and KTf in cyclohexanone; all master solutions were prepared in a concentration of 10 mg/ml. Two active-layer inks were prepared. The "yellow ink" was prepared as described in embodiment one. The "blue ink" was prepared by blending the master solutions in a (SB:PEG-DMA:KTf) mass ratio of (1:0.5:0.1), and then adding 1.75 ml of THF and 0.25 ml of cyclohexanone to 2 ml of the blend solution.

1 ml of the yellow ink was sprayed 10a through a patterned shadow mask 8, 81 onto the pre-patterned ITO-coated glass substrate 2 (pre-cleaned by UV-ozone exposure for 10 min) (FIGS. 3a-3b). 2 ml of the blue ink was thereafter sprayed through a simple rectangular shadow mask 6, 61 onto the yellow-emitting film (FIG. 3c). The bi-layer active material 4, 4' was dried at 70° C. in a nitrogen-filled glove box ([O$_2$]<1 ppm, [H$_2$O]<3 ppm) for 4 h, where after an Al top electrode 3 (100 nm thickness) was thermally evaporated through a shadow mask 7, 71 on top of the active layer film 4, 4' (FIG. 3d). FIG. 4 displays the patterned two-colored light-emission from three of the eight 5.5 cm² segments in a large-scale LEC device 1 biased at 5 V.

Hence, according to this second embodiment, there is provided a method for producing a light-emitting electrochemical cell, comprising the steps of:

providing a non-conducting substrate, pre-provided with a patterned, transparent, electrically conducting surface layer, which is to provide a first electrode layer;

optionally depositing by spray-coating in ambient conditions, an additional conducting layer onto the first electrode layer, making it a bi-layer electrode;

depositing, by spray coating in ambient conditions, a first part of an active material layer onto the first electrode layer, or bilayer, as the case may be;

depositing, by spray coating in ambient conditions, a second part of an active material layer onto the first electrode layer, or onto the conducting layer, as the case may be, using a different active material; and depositing, optionally by spray coating in ambient conditions, a second electrode layer onto the active material layer.

Embodiment 3

All-Sprayed Light-Emitting Device Fabricated Under Ambient Conditions

Figures 5A, 5B, 5C:
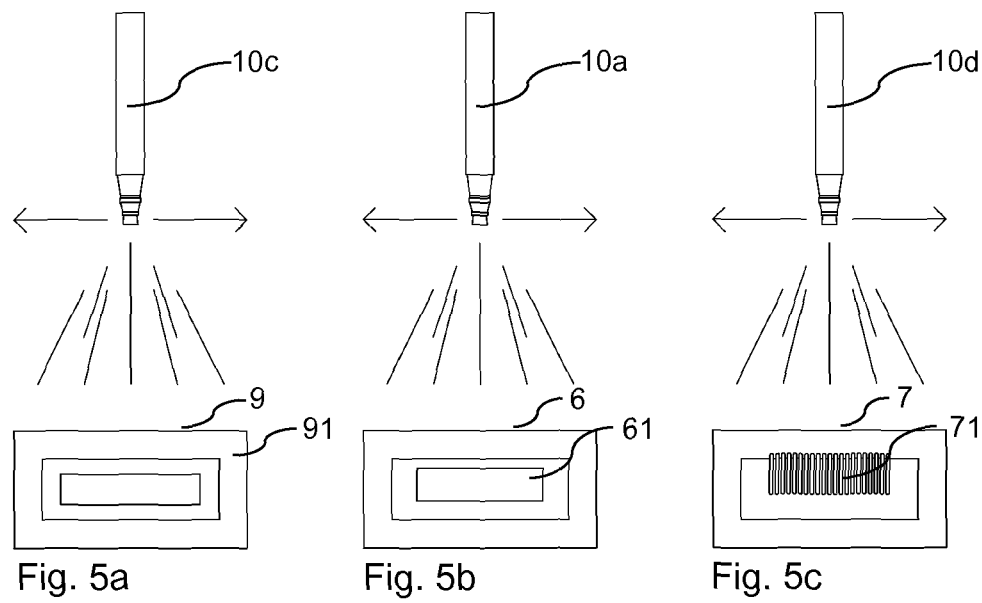
FIGS. 5a-5e schematically illustrate structures used or obtained during the process of manufacturing a third embodiment of a light-emitting device.
Figure 5D:
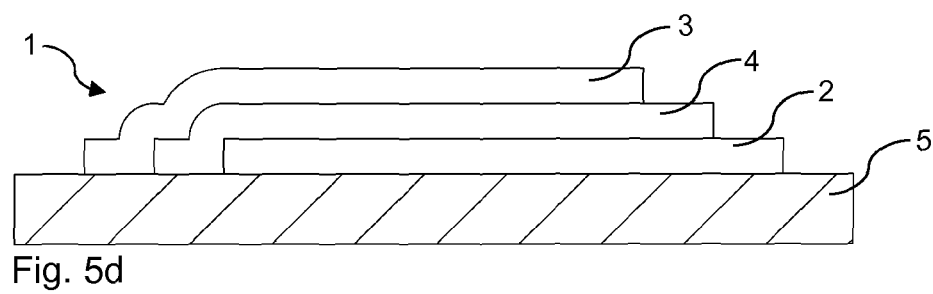
Figure 5E:
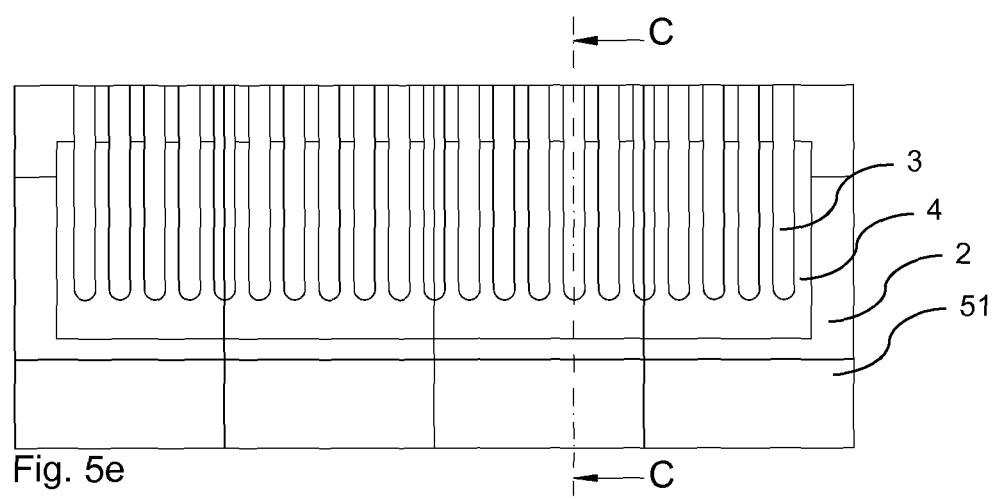
Figure 6A:
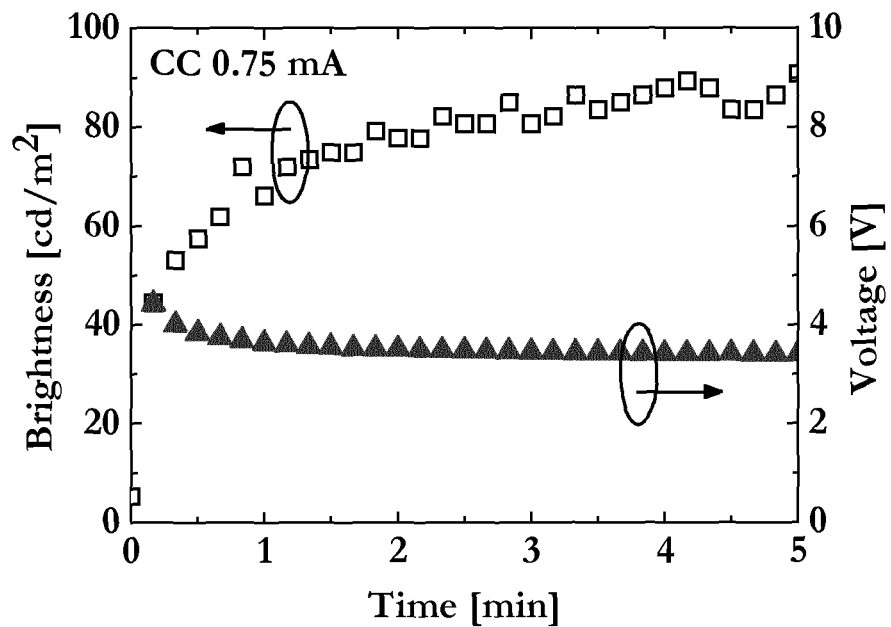
FIGS. 6a-6b are graphs illustrating performance of a light-emitting device according to the third embodiment.
Figure 6B:
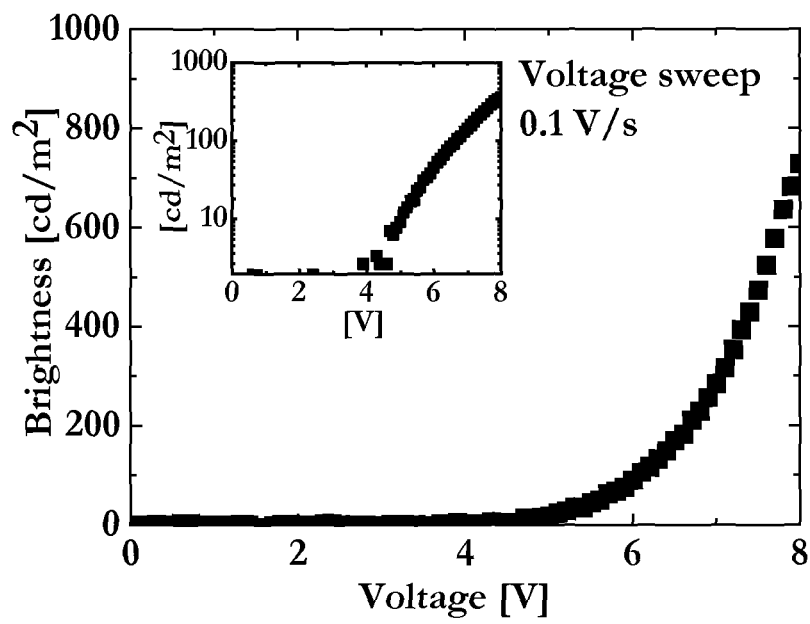
Figure 7:
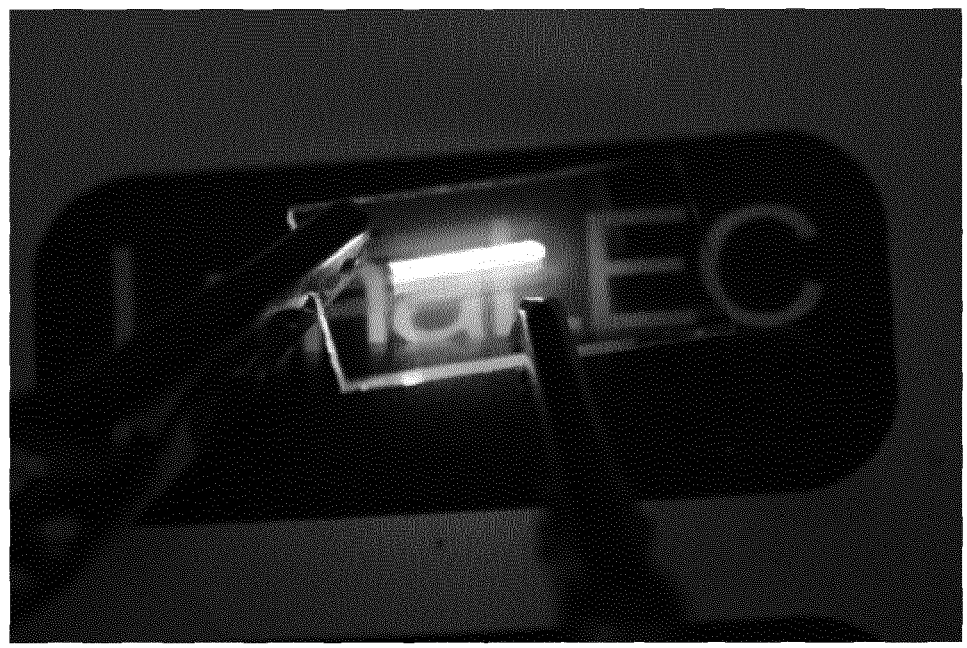
FIG. 7 is a photo illustrating the fact that light (white portions) was generated by a light-emitting device according to the third embodiment.

FIGS. 5a-5e show schematic device fabrication and schematic device structure of an all-sprayed light-emitting device 1, FIGS. 6a, 6b show measured device performance and FIG. 7 is a photograph of the light-emission from such a device. In FIGS. 5a-5c consecutive fabrication steps are shown presenting first the sequential spray-coating 10c of silver nanowires (Ag-NWs) and PEDOT:PSS for the bottom electrode 2, FIG. 5a. FIG. 5b shows the spray-coating 10a of the active layer 4, and FIG. 5c shows the sequential spray-coating 10d of Ag-NWs and the active material for the top electrode 3; the latter layer was included for a better adhesion of the Ag-NWs to the beneath active layer 4. In FIG. 5d a cross-sectional view, and in FIG. 5e a top view, of the device structure 1 are shown. FIGS. 5a-5c show the active layer/Ag-NW bilayer top electrode 3, the active layer 4, the PEDOT:PSS/Ag-NW bilayer bottom electrode 2 and the substrate 5. In FIG. 6a the optoelectronic response for a pristine all-sprayed glass/Ag-NW/PEDOT:PSS/(SY+PEG-DMA+KTf)/Ag-NW device during galvanostatic operation at 0.75 mA is shown and in FIG. 6b a voltage-ramp operation at dV/dt=0.1 V/s is shown. The photograph in FIG. 7 shows the light-emission from an all-sprayed device 1 when biased at 5 V.

This embodiment demonstrates the fabrication of an entire light-emitting device 1 using spray-coating as the only deposition technique. It is notable that the sequential spray-coating was executed under uninterrupted ambient conditions in an environment containing a significant concentration of dust particles, i.e. no clean room is used. This particular device 1 is semitransparent; see photograph in FIG. 7.

FIGS. 5a-5c display the fabrication, structure and operation of an all-sprayed, semi-transparent light-emitting device 1. An Ag-NW ink was prepared by dispersing 20 mg Ag-NWs (SLV NW-90, Blue Nano) in a mixed solvent system, comprising ethanol (2 ml), isopropanol (16 ml), and cyclohexanone (2 ml), and thereafter sonicating the dispersion for 5 min. A PEDOT:PSS ink was prepared by mixing 10 ml of a purchased PEDOT:PSS dispersion (Clevios S V3, Heraeus) with 5 ml of isopropanol and 0.5 ml of ethylene glycol. Glass substrates 5 (W×L×H=15×26×1 mm$^3$) were sequentially spray-coated with the Ag-NW ink and the PEDOT:PSS ink through a rectangular shadow mask 9 defining an anode area 91 of 15×13 mm$^2$ (FIG. 3A). The spray-coated Ag-NW layer was heated to 130 C, before being spray-coated with PEDOT:PSS. A typical functional anode required 4 ml of Ag-NW ink and 1 ml of PEDOT:PSS ink. The Ag-NW/PEDOT-PSS bilayer anode 2 was dried on a hot plate at 130° C. for 4 h before deposition of the active layer 4.

The active layer 4 consisted of SY, PEG-DMA, and KTf. Master solutions, with a concentration of 10 mg/ml, were prepared for all constituents using toluene as the solvent for SY and cyclohexanone as the solvent for PEG-DMA and KTf. The active-material ink was prepared by blending 10 ml of the SY master solution, 5 ml of the PEG-DMA solution, and 1 ml of the KTf solution; and thereafter adding 10 ml of cyclohexanone to obtain the appropriate viscosity. 4 ml of the active-material ink was spray-coated through a shadow mask 6 (area 61=15×14 mm$^2$) onto the bilayer anode 2 (FIG. 5b). The active layer 4 was slightly offset with respect to the anode 2 to ensure that the bottom anode 2 was completely covered by the active layer 4 at the edge onto which the top electrode 3 was to be deposited, while leaving the other anode 2 edge uncoated to facilitate easy contacting.

The top cathode 3 was fabricated by sequentially spray-coating first 8 ml of the Ag-NW ink and then 1 ml of the active-material ink on top of the active layer 4 (FIG. 5c). The roles of the final capping active-layer is to provide better adhesion, and improve the contact area, between the Ag-NWs and the beneath active layer 4. The cathode 3 was coated through a shadow mask 7 defining several "fingers" 71 (each with an area of 1.5×16 mm$^2$), which were laterally separated by 1 mm. Half of each finger was positioned on top of the bottom anode 2, and the overlap of the two electrodes 2, 3 defined the actual light-emitting device. The rest of the finger (positioned on top of the insulating glass substrate 51) was used as a contact pad, to which an external power source could be connected.

The spray-coated devices 1 were characterized using a computer-controlled source-measure unit (Agilent U2722A) and a photodiode equipped with an eye-response filter (Hamamatsu Photonics S7686). The signal from the photodiode was amplified and measured using a data-acquisition card (National Instruments USB-6009).

FIG. 6a demonstrates the LEC effect in the form of an increasing brightness and a decreasing voltage when a constant current of 0.75 mA is sourced to a pristine device, and FIG. 6b displays the current and brightness during a 0-8 V voltage sweep, using a sweep rate of 0.1 V/s. The LEC device displays a high efficacy of 2 lm/W, and is capable of high brightness (800 cd/m2).

Hence, according to this third embodiment, there is provided a method for producing a light-emitting electrochemical cell, comprising the steps of:

providing a non-conducting substrate, depositing, by spray coating in ambient conditions, a conducting first electrode layer onto the substrate, optionally depositing by spray-coating in ambient conditions, an additional conducting layer on the first electrode layer, making it a bilayer electrode;

depositing, by spray coating in ambient conditions, a first active material layer onto the first electrode layer, or bilayer, as the case may be; and depositing, by spray coating in ambient conditions, a second electrode layer onto the active material layer.

Embodiment 4

Figure 9:
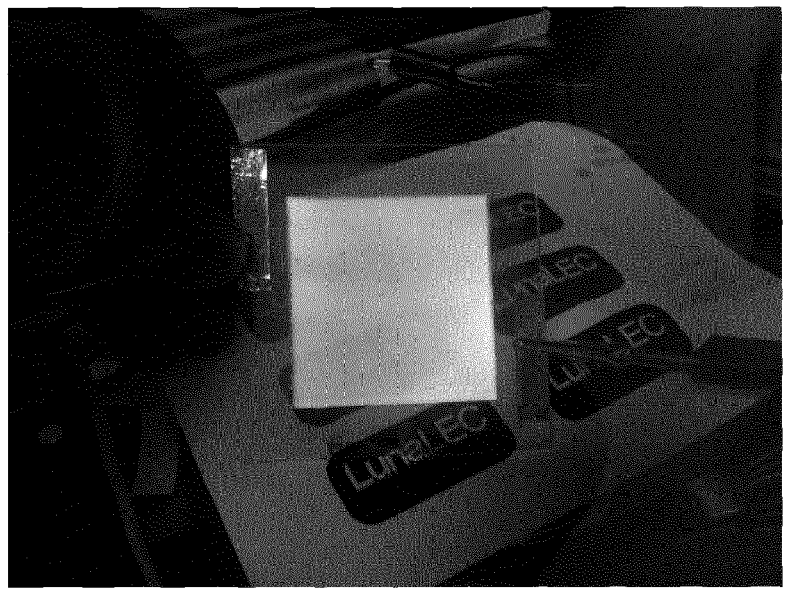
FIG. 9 is a photo illustrating the fact that light (white portions) was generated by a light-emitting device according to the fourth embodiment.

Large-Area all-Sprayed Light-Emitting Device Fabricated Under Ambient Conditions The fabrication of an all-sprayed 60×60 mm$^2$ large-area glass/Ag-NW/PEDOT:PSS/SY+PEG-DMA+KTf/Ag-NW device is illustrated in FIGS. 8a-c, FIGS. 8d and 8e show the device structure, and FIG. 9 the light-emission from such a device. In FIGS. 8a-c consecutive spray steps 10c, 10a, 10d are shown, where FIG. 8a shows the sequential spray-coating of Ag-NWs and PEDOT:PSS, FIG. 8b the spray-coating of the active layer 4, and FIG. 8c the sequential spray-coating of Ag-NWs and the active material for the top electrode 3; the latter layer was included for a better adhesion of the Ag-NWs to the beneath active layer. FIG. 8d shows a cross-sectional view, and FIG. 8e a top view of the device 1 structure with the active layer/Ag-NW bilayer top electrode 3, the active layer 4, the PEDOT:PSS/Ag-NW bilayer bottom electrode 2 and the substrate 51. The photograph in FIG. 9 displays the light-emission from a large-area all-sprayed device when biased at 5 V.

FIGS. 8a-8c display the fabrication and FIG. 9 the light emission from a glass/Ag-NW/PEDOT:PSS/SY+PEG-DMA+KTf/Ag-NW device, with all constituent layers spray-coated under uninterrupted ambient conditions. As such, the device structure is identical with that in embodiment 3, but the important distinction is that this device exhibits a significantly larger area and features large-area light-emission. This is thus a demonstration of the opportunity for scale up that the spray-coating fabrication method provides.

The anode 2 in this large-area device comprised a Ag-NW/PEDOT:PSS bilayer using inks prepared using the same methods as outlined in embodiment 3. 4 ml of the Ag-NW ink was consumed during the coating of the 90×90 mm$^2$ glass substrate 51. By using a shadow mask 9, a 70×70 mm$^2$ area 91 was evenly spray coated (FIG. 8a) and dried at 130° C. for 1 min. The same shadow mask 9 was then utilized for the spraying of the PEDOT:PSS to ensure that both layers were exactly aligned. While the substrate was still hot, 1 ml of the PEDOT:PSS ink was sprayed on top of the Ag-NW film.

The active layer 4 comprised a SY, PEG-DMA and KTf blend, and was prepared using the same method as outlined in embodiment 3. A sufficiently thick active layer 4 was achieved by spraying 5 ml of the active-layer ink through a shadow mask 6 (FIG. 8b).

The top cathode 3 comprised Ag-NWs, and 8 ml of dispersion was spray-coated on top of the active layer 4 through a shadow mask 7 (FIG. 8c). Thereafter, 1 ml of active-layer ink was sprayed on top of the Ag-NWs to allow for better adhesion of the Ag-NWs and to increase the interfacial area between the Ag-NWs and the active layer 4.

The complete device structure 1, as depicted in FIG. 8d, was dried at 70° C. for 4 h in a nitrogen-filled glove box ($[O_2]<1$ ppm, $[H_2O]<3$ ppm) before being tested. The light emission from such a large-area device 1 during biasing at 5 V is presented in the photograph in FIG. 9 in the lower part of FIG. 4.

Hence, according to this fourth embodiment, there is provided a method for producing a light-emitting electrochemical cell, comprising the steps of:

providing a non-conducting substrate, depositing, by spray coating in ambient conditions, a conducting electrode layer onto the substrate, optionally depositing by spray-coating in ambient conditions, an additional conducting layer onto the first electrode layer making it a bilayer electrode;

depositing, by spray coating in ambient conditions, a first active material layer onto the first electrode layer or bilayer, as the case may be; and depositing, by spray coating in ambient conditions, a second electrode layer onto the active material layer.

Embodiment 5

Large-Area all-Sprayed Light-Emitting Device Fabricated on a Flexible Substrate

Figure 10:
FIG. 10 is a photo illustrating the fact that light was generated by a light-emitting device according to the fifth embodiment.

In this embodiment the same manufacturing steps and conditions were used as in embodiment 4 but here a flexible substrate was used. The light emission from such a large-area flexible device during biasing at 5 V is presented in the photograph in FIG. 10.

Hence, according to this fifth embodiment, there is provided a method for producing a light-emitting electrochemical cell, comprising the steps of:

providing a non-conducting, flexible substrate, such as a polymer material, paper or fabric-type material;

depositing, by spray coating in ambient conditions, a conducting electrode onto the substrate, optionally depositing by spray-coating in ambient conditions, an additional conducting layer onto the first electrode layer, making it a bilayer electrode;

depositing, by spray coating in ambient conditions, a first active material layer onto the first electrode layer, or bilayer, as the case may be; and depositing, by spray coating in ambient conditions, a second electrode layer onto the active material layer.

Embodiment 6

Figures 11A, 11B, 11C, 11D:
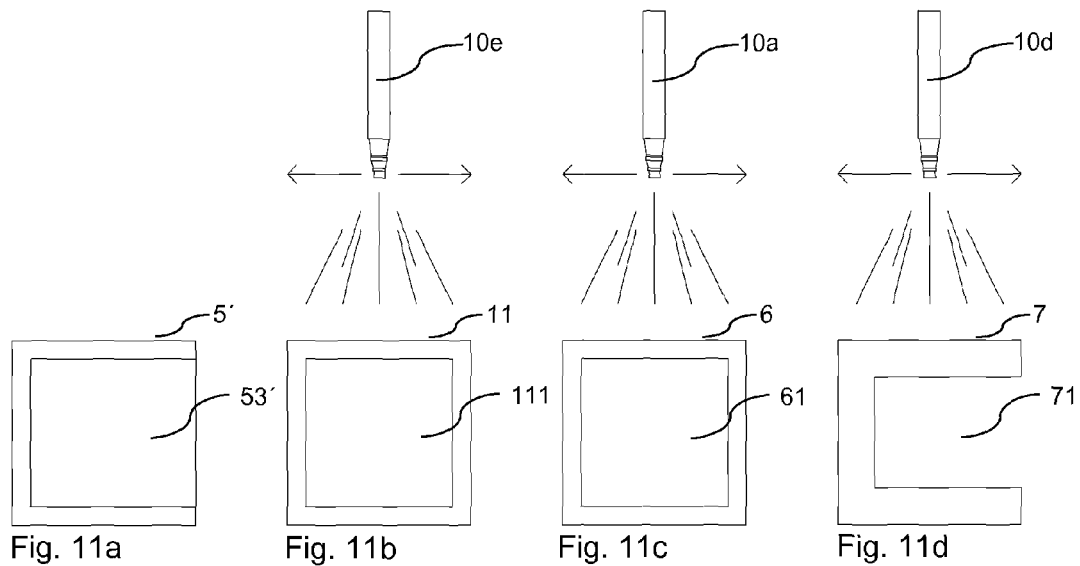
FIGS. 11a-11f schematically illustrate structures used or obtained during the process of manufacturing a sixth and seventh embodiment, respectively, of a light-emitting device.
Figure 11E:
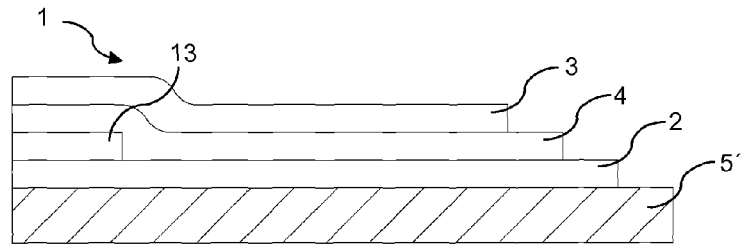
Figure 11F:
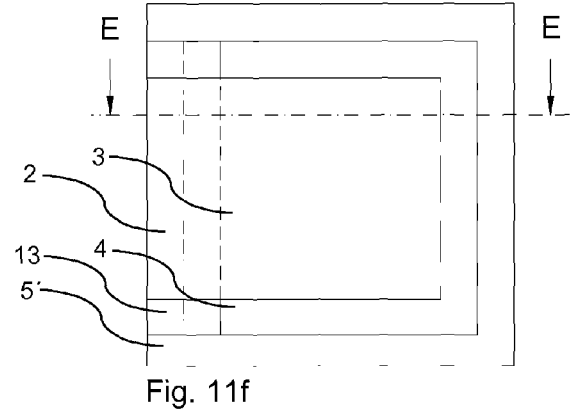
Figure 12:
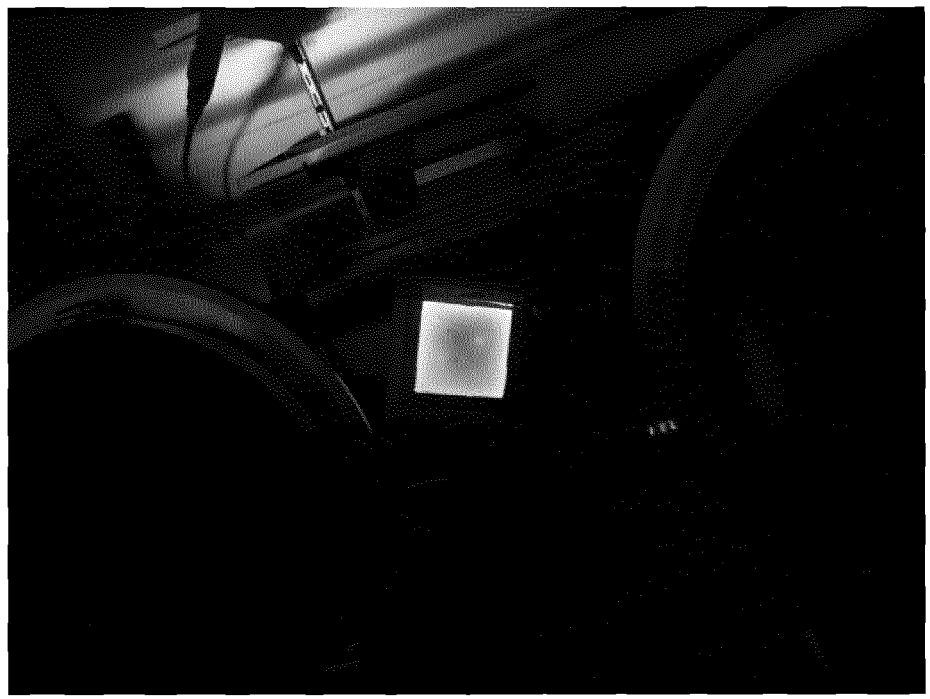
FIG. 12 is a photo illustrating the fact that light (white portions) was generated by a light-emitting device according to the sixth embodiment.

Utilizing a Metal Surface as a Combined Substrate and Electrode in an all-Sprayed Large-Area Light-Emitting Device The fabrication of an all-sprayed 60×60 mm² large-area Al/PEDOT:PSS/SY+PEG+KTf/Ag-NW device is illustrated in FIGS. 11a-d, the device structure is shown in FIGS. 11e, 11f and the light-emission is shown in FIG. 12. A milled Al plate 53' is used as substrate 5', FIG. 11a, the spray-coating of the milled Al plate with PEDOT:PSS in FIG. 11b, the coating of the active layer 4 in FIG. 11c, and the coating of Ag-NWs 3 and the active material necessary to adhere the wires to the device in FIG. 11d. FIG. 11e shows a cross section view of the device structure with the active layer/Ag-NWs 3, the active layer 4, the PEDOT:PSS layer, the Al substrate 5', and the heat resistant tape 13 used to further separate the top electrode 3 contact point from the Al substrate 5'. In FIG. 11f a top view of the finished device 1 is shown. Light-emission from a 5 V biased all-sprayed device in a lighted environment is shown in FIG. 12.

LEC devices 1 using bulky metal substrate as one of the electrodes allows very efficient cooling of the device. Cooling is very important if a high brightness from a large area device is to be achieved.

FIGS. 11a-11f display a 36 cm² device 1 where all constituents were deposited using the spray-coating method, and where the substrate 5' also functions as an electrode 2. The fabrication is very similar to that used for embodiment 3, 4, and 5, but with the critical difference that the substrate 5' itself acts as an integral part of the bottom electrode structure 2. This helps alleviate resistive losses in the electrode 2, and improves the cooling of the device 1 as the heat is more effectively transported away from the light emitting junction compared to the insulating substrates normally employed. Moreover, a bulky electrode represents a much larger thermal mass, with a concomitant larger heat capacity. The constituents consist of Al, Ag-NWs, PEDOT:PSS, SY, PEG-DMA, and KTf. Using these materials, three sprayable coating inks were made; an Ag-NW ink, a PEDOT:PSS ink, and an active layer ink.

A 1 mm thick Al plate 5' was milled to create a flat and reflective surface 53' (FIG. 11a). The surface was cleaned using isopropanol, and dried at 130° C. for 5 min.

A sprayable PEDOT:PSS dispersion was made using a 2:1 volume ratio between Clevios S V3 mixed with isopropanol. By using a shadow mask 11, a 90×90 mm² area 111 was evenly spray coated using 0.5 ml of the PEDOT:PSS ink (FIG. 11b). The film was dried at 130° C. for 4 h. A heat resistant tape 13 was attached along one of the edges of the Al substrate 53' after the PEDOT:PSS layer had dried (FIGS. 11e, 11f), onto which contact with the top electrode 3 could be made.

SY was dissolved in toluene while PEG-DMA and KTf were both dissolved in cyclohexanone. The active layer ink was made by mixing 10 mg/ml solutions of these materials in a 1:0.5:0.1 [SY:PEG-DMA:KTf] mass ratio. An active layer film 4 was made using 2.5 ml of this ink mixed with 2.5 ml of cyclohexanone, sprayed through a shadow mask 6 (FIG. 11c). The Ag-NWs were dispersed in a 1:8:1 solution of ethanol, isopropanol, and cyclohexanone, and 8 ml of this Ag-NW ink was sprayed onto the active layer 4 (FIG. 11d). After the dispersion was sprayed, 1 ml of active layer ink was sprayed to adhere the Ag-NW to the surface and to increase the interfacial area between the Ag-NW and the active layer.

The device was dried at 70° C. for 4 h in a nitrogen-filled glove box. The oxygen was kept below 1 ppm and the water below 3 ppm.

The photograph in FIG. 12 shows a device driven by a 5 V bias.

Hence, according to this sixth embodiment, there is provided a method for producing a light-emitting electrochemical cell, comprising the steps of:

providing a conducting substrate functioning as the electrode, such as a metal substrate or a substrate having a conducting surface coating, such that the substrate or its surface coating forms a conducting layer, optionally depositing by spray-coating in ambient conditions, an additional electrode layer onto the first layer, making it a bi-layer electrode;

depositing, by spray coating in ambient conditions, a first active material layer onto the first electrode layer, or bilayer, as the case may be; and depositing, by spray coating in ambient conditions, a second electrode layer onto the active material layer.

Embodiment 7

Utilizing a Complex-Shaped Metal Surface as a Combined Substrate and Electrode in an all-Sprayed Light-Emitting Device In this embodiment an all-sprayed non-flat large-area stainless steel/PEDOT:PSS/SY+PEG+KTf/Ag-NW device was manufactured.

Figure 13A:
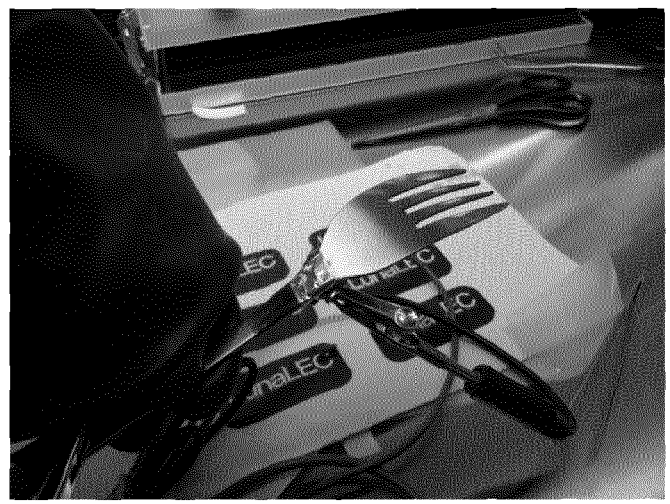
FIGS. 13a-13b are photos illustrating the fact that light was generated by a light emitting device according to the seventh embodiment.
Figure 13B:
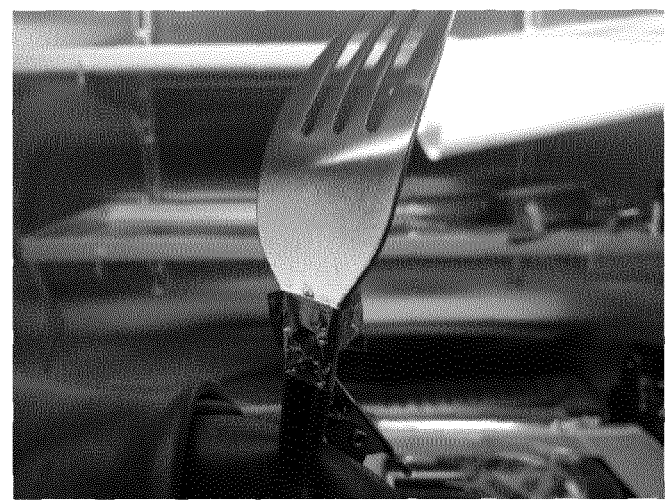

FIGS. 13a, 13b display a non-flat device where all constituents were deposited using the spray-coating method, and where the substrate 5' also acts as an electrode 2. The constituents consist of a stainless steel fork, Ag-NWs, PEDOT:PSS, SY, PEG-DMA, and KTf. Using these materials, three sprayable coating inks were made: an Ag-NW ink, a PEDOT:PSS ink, and an active-layer ink.

A stainless steel fork was cleaned using isopropanol, and dried at 130° C. for 5 min.

A sprayable PEDOT:PSS dispersion was made using a 2:1 volume ratio between Clevios S V3 mixed with isopropanol. An area was evenly coated using 0.5 ml of the PEDOT:PSS ink. The film was dried at 130° C. for 4 h. A heat resistant tape was attached to the stainless steel substrate 5 after the PEDOT:PSS layer had dried, onto which contact with the top electrode 3 could be made.

SY was dissolved in toluene while PEG-DMA and KTf were both dissolved in cyclohexanone. The active layer ink was made by mixing 10 mg/ml solutions of these materials in a 1:0.5:0.1 [SY:PEG-DMA:KTf] mass ratio. An active layer film was made using 2.5 ml of this ink mixed with 2.5 ml of cyclohexanone.

The Ag-NWs were dispersed in a 1:8:1 solution of ethanol, isopropanol, and cyclohexanone, and 8 ml of this Ag-NW ink was sprayed onto the active layer 4. After the dispersion was sprayed, 1 ml of active layer ink was sprayed as well to adhere the wires to the surface and to increase the interfacial area between the nanowires and the active layer 4.

The device was dried at 70° C. for 4 h in a nitrogen filled glove box. The oxygen was kept below 1 ppm and the water below 3 ppm.

FIGS. 13a, 13b demonstrate the resulting light-emission under a modest voltage bias of 5 V.

Hence, according to this seventh embodiment, there is provided a method for producing a light-emitting electrochemical cell, comprising the steps of:

providing a conducting substrate, such as a metal substrate, or a substrate having a conducting surface coating, such that the substrate or its surface coating forms a conducting layer, the substrate having a curved macro structure;

optionally depositing by spray-coating in ambient conditions, an second conducting layer onto the first electrode layer, making it a bi-layer electrode;

depositing, by spray coating in ambient conditions, a first active material layer onto the first electrode layer, or onto the conducting layer, as the case may be; and depositing, by spray coating in ambient conditions, a second electrode layer onto the active material layer.

Embodiment 8

Multilayer Architecture for the Realization of a RGB-Emitting LEC

Figure 14G:
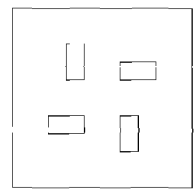
FIGS. 14a-14j schematically illustrate structures used or obtained during the process of manufacturing an eight embodiment of a light-emitting device.
Figure 14F:
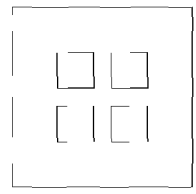
Figure 14E:
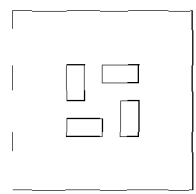
Figure 14D:
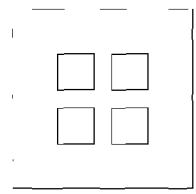
Figure 14C:
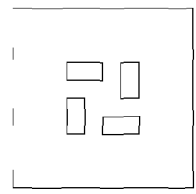
Figure 14B:
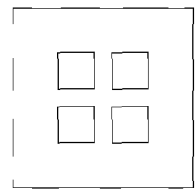
Figure 14A:
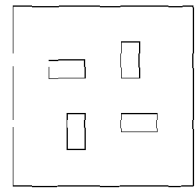
Figure 14J:
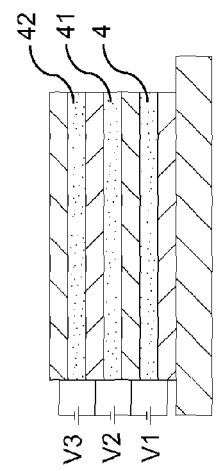
Figure 14I:
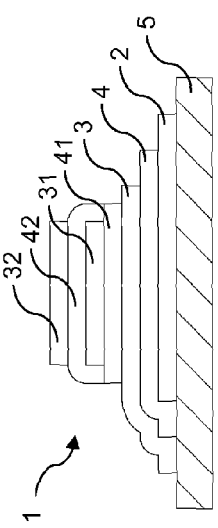
Figure 14H:
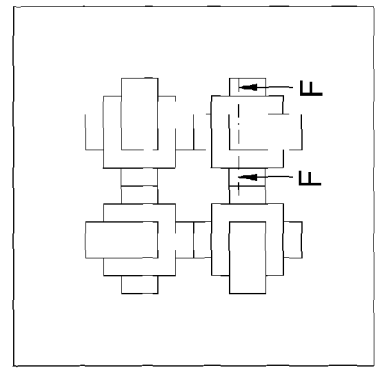

In FIGS. 14a-14j the fabrication of an all sprayed color controllable device where Ag-NW/PEDOT:PSS layers in FIGS. 14a, 14c, 14e, 14g contact and separate the red (FIG. 14b), the green (FIG. 14d), and blue (FIG. 14f) active layers 4, 4'. In FIG. 14h a top view of four completed devices is shown. In FIG. 14i a cross section view of the device structure where the Ag-NW/PEDOT:PSS layers 2, 3, 31, 32 and the red 4, green 41, and blue 42 active layers are shown. In FIG. 14j an electronic configuration is shown in which each active layer 4, 41, 42 can be controlled with an individual voltage supply.

FIGS. 14a-14j display four 1×1 cm$^2$ multi layered devices where all constituents were deposited using the spray-coating method. The constituents consist of Ag-NWs, PEDOT:PSS, SY, SB, a red-emitting polymer, such as poly[2-methoxy-5-(2-ethyl-hexyloxy)-1,4-phenylenevinylene] (MEH-PPV), PEG-DMA, and KTf. Using these materials, five sprayable coating inks were made: an Ag-NW ink, a PEDOT:PSS ink, and three active layer inks, one for each light-emitting conjugated polymer.

A glass plate 5, 9×9 cm2, was cleaned with detergent and water, rinsed with water, rinsed with isopropanol and finally treated with UV-ozone for 10 min.

The Ag-NWs were dispersed in a 1:8:1 solution of ethanol, isopropanol, and cyclohexanone, and 4 ml of this Ag-NW ink was sprayed onto the glass plate through a shadow mask (FIG. 14a). A sprayable PEDOT:PSS dispersion was made using a 2:1 volume ratio between Clevios S V3 mixed with isopropanol, and 0.5 ml was sprayed using the same shadow mask as for the Ag-NWs. The film was dried at 130° C. for 1 min. SY, SB, and MEH-PPV were dissolved in toluene while PEG-DMA and KTf were both dissolved in cyclohexanone. The active layer inks were made by mixing 10 mg/ml solutions of these materials in a 1:0.5:0.1 [SY/SB/MEH-PPV:PEG-DMA:KTf] mass ratio. The active layer films 4, 41, 42 were made using 2.5 ml of these inks mixed with 2.5 ml of cyclohexanone, using a new shadow mask (FIGS. 14b, 14d, 14f).

An Ag-NW film was sprayed onto the active layer using 4 ml of Ag-NW dispersion and a new shadow mask (FIGS. 14c, 14e, 14g). To adhere the wires to the surface, 1 ml of active layer film was directly coated onto wires. Finally, 0.5 ml of PEDOT:PSS dispersion was coated, using the same shadow mask, to cap the device and ensure that a good contact is made onto which the next active layer can be deposited. The layers were dried at 130° C. for 1 min. This procedure was repeated three times using the different active layer inks and shadow mask alignments.

The resulting device consists of four electrodes 2, 3, 31, 32 and three active layers 4, 41, 42 thus creating three LECs 1 stacked on top of each other.

The device was dried at 70° C. for 4 h in a nitrogen filled glovebox. The oxygen was kept below 1 ppm and the water below 3 ppm.

The three LECs can be controlled individually by applying a voltage bias over each device. It is also possible to drive the same current through all LECs by applying a voltage bias over the bottom 2 and top electrode 32.

Hence, according to this eighth embodiment, there is provided a method for producing a light-emitting electrochemical cell, comprising the steps of:

providing a non-conducting substrate, depositing, by spray coating in ambient conditions, a conducting electrode layer onto the substrate, optionally depositing by spray-coating in ambient conditions, an additional conducting layer onto the first electrode layer, making it a bilayer electrode;

depositing, by spray coating in ambient conditions, a first active material layer onto the first electrode layer, or bilayer, as the case may be;

depositing, by spray coating in ambient conditions, a second conducting electrode layer onto the first active material layer;

optionally depositing by spray-coating in ambient conditions, a second conducting layer onto the second electrode layer, making it a bilayer;

depositing, by spray coating in ambient conditions, a second active material layer onto the second electrode layer, or bilayer, as the case may be; and depositing, by spray coating in ambient conditions, a third electrode layer onto the second active material layer.

Embodiment 9

Multilayer LEC with Designed Active Layer Composition for Improved Performance

Figure 16:
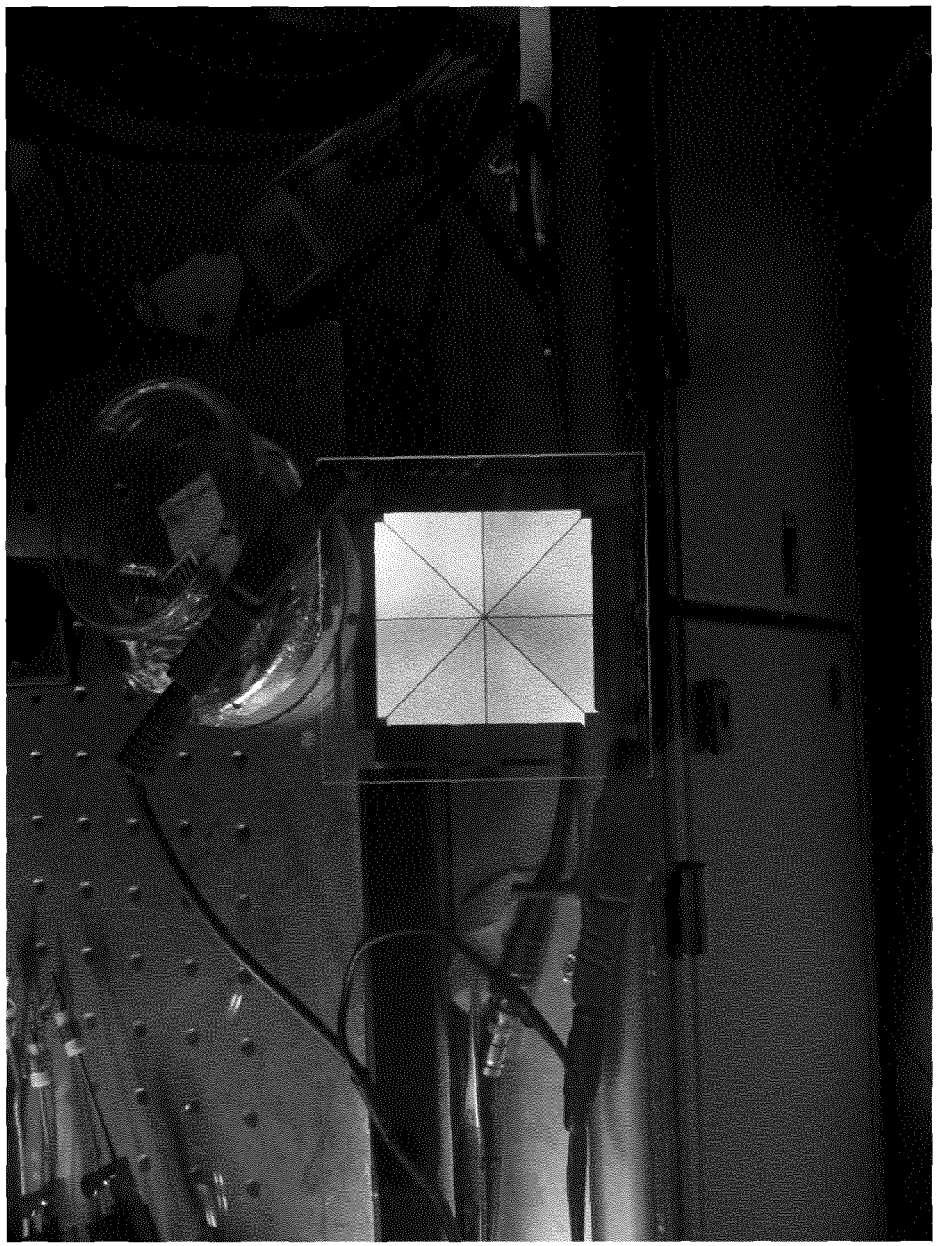
FIG. 16 is a photo illustrating the fact that light (white portions) was generated by a light-emitting device according to the ninth embodiment.
Figure 18A:
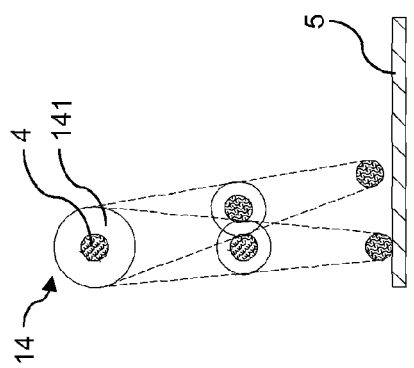
FIGS. 18a-18h schematically illustrate the deposition of atomized droplets onto a substrate using different vapor pressure solution systems.
Figure 18B:
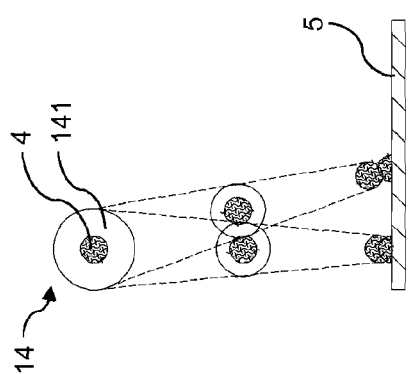
Figure 18C:
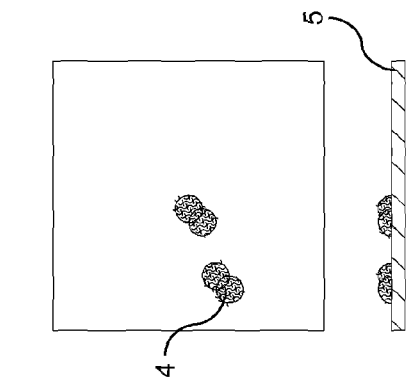
Figure 18D:
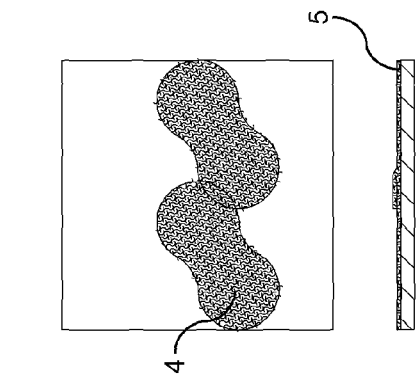
Figure 18E:
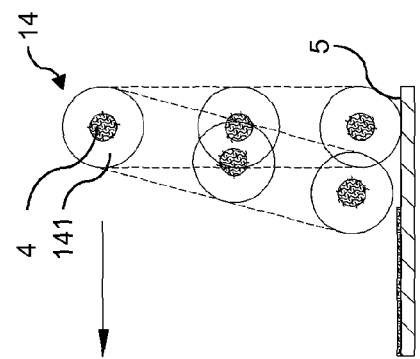
Figure 18F:
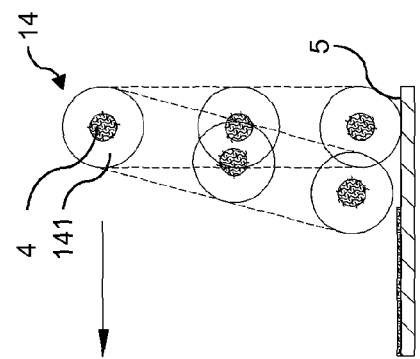
Figure 18G:
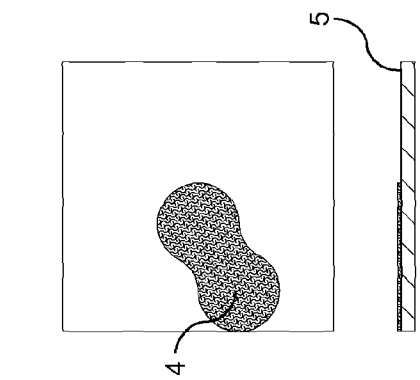
Figure 18H:
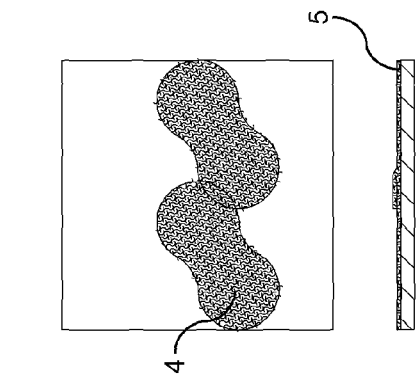

A schematic illustration of the fabrication and structure of an 8-segment large-area LEC device 1 with a spray-coated multi-layered configuration is shown in FIGS. 15a-15e. A photograph of the light-emission is shown in FIG. 16. In FIGS. 15a-15e the consecutive fabrication steps are shown with a pre-patterned ITO-coated 52 substrate 51 (FIG. 15a), spray-coating of the first electrolyte containing active layer (FIG. 15b), spray-coating of an electrolyte free active layer (FIG. 15c), spray-coating of a second electrolyte containing active layer (FIG. 15d), and the pattern of the Al top electrode 3 (FIG. 15e). In FIG. 15f a cross-sectional view is shown and in FIG. 15g a top view of the device structure is shown, with an Al cathode 3, a first electrolyte containing active layer 4, an electrolyte-free active layer 121, a second electrolyte containing active layer 4', a patterned ITO anode 2, and a substrate 51. In FIG. 16 a 44 $cm^2$ large-area device driven at 3 V is shown.

It has been shown that the lifetime of a LEC 1 is negatively affected by the existence of electrolyte at or near the pn-junction during light-emission. This issue has to some extent been solved by using an electrolyte system in which all constituents are mobile. Using an optimized concentration of such an electrolyte, the pn junction can be made essentially electrolyte-free under steady-state operation. However, such a solution can be sensitive to active layer thickness and/or electrolyte-concentration variations. It is thus relevant to develop alternative and more robust strategies to electrolyte-free pn junctions in LECs 1.

Using our spray-coating technique, the desired active-layer composition can be designed during fabrication. Two inks are prepared. The first ink comprises a blend of an electrolyte and a conjugated material. The second ink comprises a light-emitting material but no electrolyte. First, a substrate comprising a conductive electrode surface is required. This can, e.g., be achieved by using the same approaches described in the previous embodiments, and the electrode can notably be spray-coated. Onto this surface, the first ink is spray-coated. In a specific embodiment, it can comprise, e.g., a blend of (SY:PEG-DMA:KTf) in a (1:1.0.2) mass ratio in a solute concentration of 5 mg/ml. A pre-patterned ITO/glass substrate (FIG. 15a) was spray-coated with 1 ml of the above specified first ink (FIG. 15b). Onto this layer, the second ink is spray-coated. In a specific embodiment, the second ink can comprise a 5 mg/ml SY solution, and 3 ml of the second ink was consumed during the spray coating of this layer (FIG. 15c). Thereafter, a layer of the first ink is spray coated. In a specific embodiment, it can comprise a blend of (SY:PEG-DMA:KTf) in a (1:1.0.2) mass ratio in a solute concentration of 5 mg/ml, and 1 ml of this ink was consumed during this spray-coating step (FIG. 15d). In a specific embodiment, the tri-layer active material was dried at 70° C. in a nitrogen-filled glove box ($[O_2]<1$ ppm, $[H_2O]<3$ ppm) for 4 h, where after an Al top electrode 3 (100 nm thickness) was thermally evaporated through a shadow mask 7 on top of the active layer film (FIG. 15e). It is notable that the top electrode 3 alternatively can be deposited by spray coating, as detailed in the previous embodiments. This resulted in a device structure, see FIGS. 15f, 15g, where two electrodes 2, 3 covered with an electrolyte-containing film 4, 4' sandwich a thick and electrolyte-free light-emitting SY film 121.

Hence, according to this ninth embodiment, there is provided a method for producing a light-emitting electrochemical cell, comprising the steps of:

providing a non-conducting substrate, depositing, by spray coating in ambient conditions, a conducting electrode onto the substrate, optionally depositing by spray-coating in ambient conditions, an additional conducting layer onto the first electrode layer, making it a bilayer electrode;

depositing, by spray coating in ambient conditions, an active material layer formed of two sub-layers: a first active material sub-layer comprising active material and an effective amount of electrolyte and a second active material sub-layer comprising substantially no electrolyte; and depositing, by spray coating in ambient conditions, a second electrode layer onto the active material layer.

Embodiment 10

R2R Sprayed LEC

FIGS. 17a-17c schematically demonstrate a simple continuous roll-to-roll fabrication of a three layered LEC device using exclusively the spray coating method.

The substrate 5 in the form of continuous web or a substrate on a continuous web carrier is supplied. At least part of the web or web carrier is unwound from a feed reel 20 and winded up at a collection reel 21. Alternatively, there is no winding up but instead a stacking step. At least one of the above discussed deposition steps are performed while the substrate is in the form of the continuous web or on the continuous web carrier.

Additional spraying stages can be easily added to facilitate multilayered devices, and a drying stage can be included after each material deposition stage if required.

A spray stage can be easily added to an existing roll to roll machine, and used in tandem with other deposition methods such as slot die coating, flexogravure, wire wound bar, etc.

Alternative solution: Mounting the airbrush onto the CNC-router, i.e. static substrate and moving spray.

Hence, according to this tenth embodiment, there is provided a method for producing a light-emitting electrochemical cell, comprising the steps of:

providing a substrate in the form of a continuous web or on a continuous web carrier, depositing, by spray coating in ambient conditions, at least one of a conducting layer, a first electrode layer, an active material layer, and a second electrode layer onto the substrate, while the substrate is still in the form of a continuous web or on a continuous web carrier.

Embodiment 11

Spray-Coated LEC Comprising Triplet Emitters

It is well known that most light-emitting conjugated polymers used in light-emitting devices (OLEDs and LECs) are singlet emitters. As such, these devices can only allow for a theoretical maximum quantum efficiency of 25%, as spin statistics dictate that 75% of the excitons are formed as triplets, which are lost as heat in singlet emitters. However, by adding guest emitters capable of triplet emission, these excitons can desirably be harvested as light. Using spray-coating deposition, triplets can be added from dilute or concentrated solutions or dispersions in a facile manner, thus allowing for a wide range of efficient and/or low-solubility materials to be utilized. Moreover, spray-coating also allows for strategic spatial positioning of the triplet-emitting material(s). A few examples to why this is desirable include the opportunity for decreased quenching of the emission from the singlet, and the opportunity for positioning of different colored triplets on either side of, or within, the pn-junction, for the attainment of multi-colored or white light emission.

The general concepts for triplet harvesting are well known, and several scientific articles that present functional material and device configurations exist, for example Reineke, S. et al. Nature, 2009, 459, 234. However, it is notably difficult to position the triplet emitters at a desired spatial location using solvent-based deposition techniques. Moreover, many triplet-emitting materials exhibit a low-solubility or low-dispersability in common solvents. In this embodiment, we show that it is possible to position triplet emitters at preferred spatial locations within the active material 4 of a light-emitting device 1 in order to allow for an improved performance, notably efficient triplet harvesting.

Using spray-coating, the desired active-layer composition can be designed during fabrication to include a triplet-emitting moiety at a desired location. In this specific embodiment, two inks are prepared. The first ink comprises a blend of an electrolyte and a conjugated material. The second ink comprises a light-emitting material featuring triplet emission. First, a substrate 5 comprising a conductive electrode 2 surface is required. This can, e.g., be achieved by using the same approaches described in the previous embodiments, and the electrode 2 can notably be spray-coated. Onto this surface, the first ink is spray-coated. In a specific embodiment, it can comprise a blend of (poly(vinyl carbazole):PEG-DMA:KTf) in a (1:1.0.2) mass ratio in a solute concentration of 5 mg/ml. A pre-patterned ITO/glass substrate was spray-coated with 1 ml of the above specified first ink. Onto this layer, the second ink is spray-coated. In a specific embodiment, the second ink can comprise a 1 mg/ml CdSe/ZnS quantum dot dispersion. In a specific embodiment the quantum dots are deposited in a thickness corresponding to 1-5 monolayers of quantum dots. Thereafter, a layer of the first ink is spray coated. In a specific embodiment, it can comprise a blend of (poly(vinyl carbazole):PEG-DMA:KTf) in a (1:1.0.2) mass ratio in a solute concentration of 5 mg/ml, and 1 ml of this ink was consumed during this spray-coating step. In a specific embodiment, the tri-layer active material was dried at 70° C. in a nitrogen-filled glove box ($[O_2]<1$ ppm, $[H_2O]<3$ ppm) for 4 h, where after an Al top electrode 3 (100 nm thickness) was thermally evaporated through a shadow mask 7 on top of the active layer film 4. It is notable that the top electrode 3 alternatively can be deposited by spray coating, as detailed in the previous embodiments. This resulted in a device structure where two electrodes 2, 3 covered with an electrolyte-containing film sandwich a thin triplet-emitting film.

The triplet-emitting materials can comprise quantum dots, and ionic and non-ionic organometallic complexes. The host materials in the first ink can comprise a wide range of materials well known to someone trained in the field.

Hence, according to this eleventh embodiment, there is provided a method for producing a light-emitting electrochemical cell, comprising the steps of:

providing a non-conducting substrate, depositing, by spray coating in ambient conditions, a conducting electrode onto the substrate, optionally depositing by spray-coating in ambient conditions, an additional conducting layer onto the first electrode layer, making it a bilayer electrode;

depositing, by spray coating in ambient conditions, a first active material layer onto the first electrode layer, or bilayer, as the case may be;

depositing, by spray coating in ambient conditions, a second active material layer onto the first active material layer;

optionally depositing, by spray coating in ambient conditions, a third active material layer onto the second active material layer;

wherein at least one of the first, second and optionally third active materials comprises at least one triplet emitter; and depositing, by spray coating in ambient conditions, a second electrode layer onto the active material layer.

Embodiment 12

Motivation and Procedures for Functional Spray-Coating

FIGS. 18a-18h schematically illustrate the deposition of atomized droplets 14 onto a substrate 5. Each droplet contains solid active material 4 dissolved in a solution system 141. FIGS. 19a-19f present micrographs and surface morphology data on material deposited with a high-vapor-pressure solvent system and with a low-vapor-pressure solvent system.

The atomized small spherical solution droplets that exit the air brush during spray coating exhibit a typical diameter of 10-70 μm, and comprise a typical solid active-material content of the order of 1% (although lower solid-material concentrations are also possible). As it is highly desirable to restrict large-scale phase separation and concentration gradients, as well as to inhibit crystallization, in the dry active-layer film for good LEC performance (homogenous light-emission, inhibition of electrolyte-induced side reactions, fast turn-on time, etc.), spray-coating deposition offers a number of appealing opportunities and advantages, as described and exemplified below.

First, if a solution system featuring a high vapor pressure is selected, it is possible to allow the solution droplets to partially, or effectively completely, dry during their transfer from the air brush to the substrate, as schematically depicted in FIGS. 18a-18d. The droplets only need to comprise a sufficient amount of softening solvent at their impingement on the surface so that they can adhere to the substrate and/or film under formation, but higher solvent concentrations can also be acceptable. As the solid active-material concentration in the droplet is above, or significantly above, the dissolution limit upon the impingement of the surface, fluid communication between the deposited droplets is, as desired, highly restricted. An outcome of this type of "high-vapor-pressure solution" deposition is that clearly distinguishable circular-shaped patterns stacked on top of each other can be identified on the surface, and within, the active-material film. A descriptive example of the result of spray-deposition of appropriate high-vapor-pressure solutionsystems is detailed below.

Second, if a solution featuring a lower vapor pressure is selected, it is possible that the droplet is left effectively unaltered by the air transfer to the substrate, but that significant fluid communication between different droplets nevertheless can be inhibited by, e.g., moving the air brush or the substrate, or both, in a raster-like motion during deposition to increase the time between droplet meetings, decreasing the rate of droplet deposition, applying the droplets in a pulsed fashion, increasing the temperature, and/or lowering the ambient pressure. The scenario in which the airbrush is moved in a raster-like motion is schematically depicted in FIGS. 18e-18h. It is notable that some limited interaction between different droplets that have impinged on each other before they have dried significantly can be anticipated, and that the diameter of the dry feature is expected to be larger in this "low-vapor-pressure solution" case, while the height is expected to be larger in the previous high-vapor-pressure solutioncase. A descriptive example of the result of spray-deposition of appropriate low-vapor-pressure solutionsystems is detailed below.

A typical functional spray coating experiment can obviously employ parts of both of the above described extreme cases.

In the following embodiment, we teach the procedures and results of a low-vapor-pressure and a high-vapor-pressure spray-coating experiment. A master solution was prepared by dissolving the light-emitting polymer superyellow (SY) in toluene in a 10 mg/ml concentration under stirring at 50° C. for 24 h. Three different ink formulations with a 5 mg/ml SY concentration were thereafter prepared by diluting this master solution: (i) a high-vapor-pressure solutionsystem comprising a 1:1 volume ratio of toluene and THF, (ii) an intermediate-vapor-pressure solutionsystem comprising solely toluene, and (iii) a low-vapor-pressure solutionsystem comprising a 1:1 volume ratio of toluene and cyclohexanone. (The general trend is that the vapor pressure of liquids at a set temperature increases with decreasing boiling point, and for reference we inform that the boiling point at ambient pressure is 66° C. for THF, 110° C. for toluene, and 156° C. for cyclohexanone.) 1.5 ml of each ink was spray coated onto 26×76 mm$^2$ glass slides, by moving the airbrush in a raster-like pattern at ~12 cm distance from the glass surface.

FIGS. 19a-19f present micrographs recorded with an optical microscope (19a and 19d) and a surface profiler (19b-19c and 19e-19f) of the dry spray-coated materials. The set of micrographs in FIGS. 19a-19c results from the air-spraying of the high-vapor-pressure solutionsystem. Very distinct circular features with a diameter ranging between 10 and 40 µm are observed on the surface. Moreover, a careful inspection of the spray-coated material reveals that several of the circular features are positioned on top of other circular features, with the "older" bottom features apparently being unaffected by the subsequent deposition of "new" features, as evidenced by the similar shape of the old and new features. This observation is in good agreement with the anticipated scenario for the high-vapor-pressure system, as outlined in FIGS. 18a-18d.

Figure 19F:
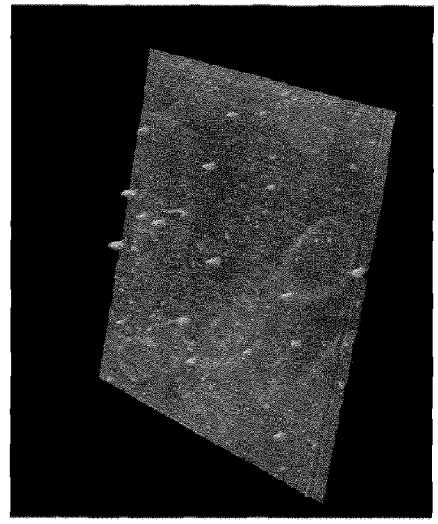
FIGS. 19a-19f are micrographs and profilometer data that illustrate the achievement of minimized fluid communication using different solution systems.
Figure 19C:
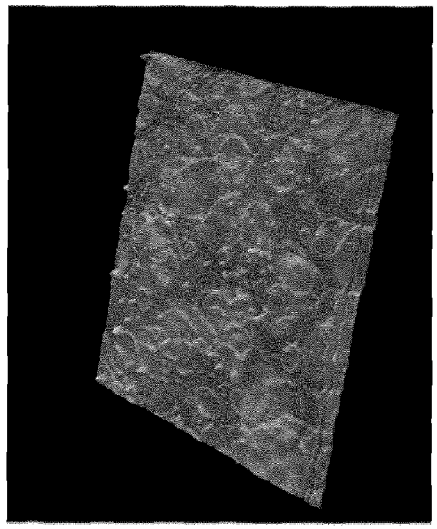
Figure 19E:
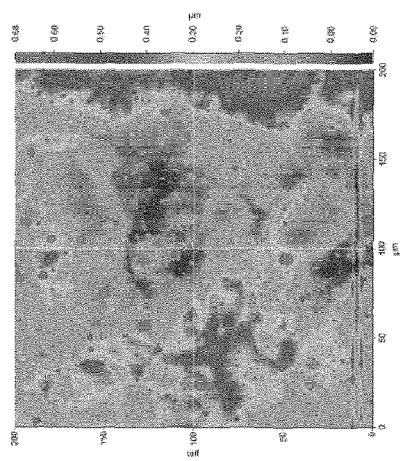
Figure 19B:
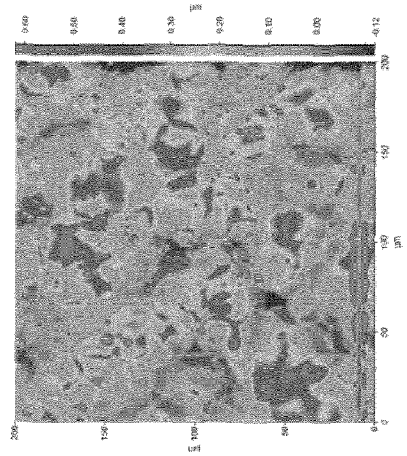
Figure 19D:
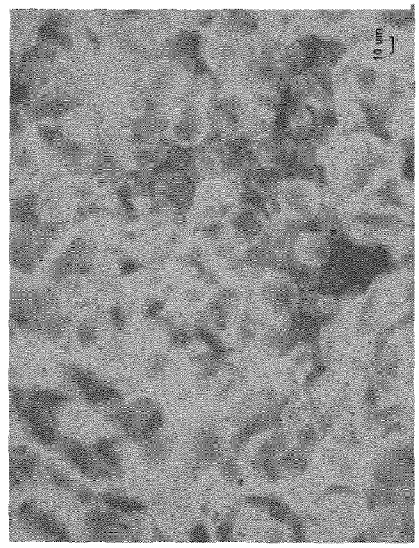

The set of micrographs in FIGS. 19d-19f was recorded on a dry material spray-coated from the low-vapor-pressure solutionsystem. Again, we observe easily identifiable borders between different circular features, but note that some of the features are larger in size, and exhibit a more non-distinct edge, than their high-vapor-pressure equivalent. A comparison of the profilometer images further reveals that also the characteristic height has decreased with the change to the low-vapor-pressure solutionsystem. We also mention that the intermediate-vapor-pressure solutionsystem, as expected, displays an intermediate behavior to the two presented cases. All these observations are in excellent agreement with the anticipated scenario presented in FIGS. 18e-18h.

We also mention that drops deposited on a rough surface may smoothen the surface via filling of voids, but that the fluid communication between the drops and the underlying surface still is inhibited due to the dry character of the latter.

Most important, however, is that the fluid communication between the different droplets and/or the underlying surface, as desired, is effectively inhibited in all investigated systems following appropriately executed spray coating, as taught in this embodiment. In the previous embodiments, we have shown that the spray-coating procedure can lead to an improved fabrication and performance of LEC devices.

Hence, according to this twelfth embodiment, there is provided a method for analyzing the spray-coated material, comprising the steps of:

providing a transparent substrate;

depositing, by spray coating in ambient conditions, material onto the substrate; and analyzing the material using micrographs.

Figure 19A:
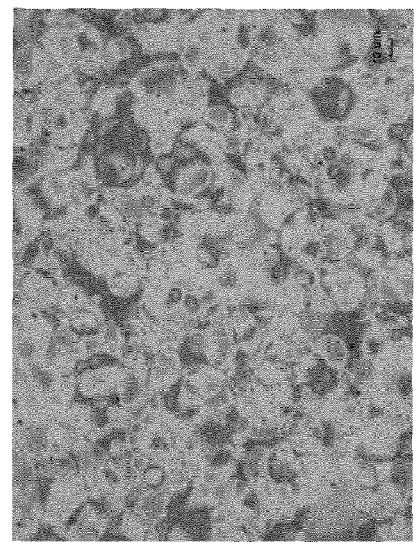

It is noted that in FIGS. 19a and 19d, droplet features are visible in an optical microscope as substantially circular or part-circular bubble-like structures having a size on the order of about 10-60 µm in diameter.

In FIGS. 19b, 19c and 19e, 19f, which are surface micrographs of the structures as shown in FIGS. 19a and 19d, respectively, droplet features are visible as crater-like rings.

The visibility of the droplet structures is indicative of the fact that very little inter-drop communication has occurred and thus of the fact that the material has the potential to generate a light homogenously over the active material surface.

It is understood that the visibility of the droplet features will be at its best in the beginning of the spray-coating process. As more layers of droplets are deposited, it will become more and more difficult to distinguish individual droplets. Hence, the visibility of the droplets may be understood as a direct result of the tuning of the spray coating process, a tuning which may be maintained throughout the spraying process of the entire layer.

The invention claimed is:

1. A method for manufacturing a light-emitting electrochemical cell comprising:
   a first electrode,
   a second electrode, and
   a first light-emitting active material in electrical contact with and separating the first and second electrodes,
      the first active material comprising mobile ions in an amount sufficient for doping the active material, wherein the method comprises a step of depositing the first active material by spray-coating at an ambient gas pressure of at least about 1 kPa, and wherein the step of spray-coating is performed such that spray droplets, when arriving at a surface being coated, are sufficiently wet to adhere to the surface, and sufficiently dry to substantially prevent fluid communication with adjacent droplets, such that spray droplets impinge on a surface layer, with surface layer defined as the topmost 100 nm of material, and such that the surface layer comprises a liquid solvent and/or dispersion-agent mass fraction of below about 90%, such that, when viewing the coated surface in a microscope, original droplet boundaries are visible.

2. The method as claimed in claim 1, wherein the liquid solvent and/or dispersion-agent mass fraction is below about 80%, below about 50%, below about 10%, below about 5% or below about 1%.

3. The method as claimed in claim 1,
wherein the step of depositing the first active material is performed at an ambient gas pressure of at least about 5 kPa, at least about 10 kPa, at least about 50 kPa, at least about 100 kPa or at least about 101 kPa, and
wherein the step of depositing the first active material is performed at an ambient gas pressure below about 1100 kPa, below about 500 kPa, below about 250 kPa, below about 150 kPa or below 105 kPa.

4. The method as claimed in claim 1,
wherein the step of depositing the first active material is performed at an ambient temperature of at least about 0° C., at least about 10° C., or at least about 15° C., and
wherein the step of depositing the first active material is performed at an ambient temperature below about 50° C., below about 40° C., below about 30° C., or below about 25° C.

5. The method as claimed in claim 1, wherein the step of depositing the first active material is performed at an ambient oxygen concentration of at least 100 ppm, at least 0.1%, at least 1%, or at least 10%.

6. The method as claimed in claim 1, further comprising a step of forming at least part of the first and/or second electrode from a substrate material and/or by deposition at a lower ambient gas pressure and/or a higher ambient temperature as compared to the step of depositing of the active material.

7. The method as claimed in claim 1, further comprising a step of providing a contact-improving layer in contact with the first active material and one of the electrodes.

8. The method as claimed in claim 1, further comprising a step of providing a conducting layer in contact with the first electrode, such that a bi-layer electrode structure is formed, comprising the conducting layer and the first electrode.

9. The method as claimed in claim 1, further comprising a step of forming at least one layer of a second light-emitting active material overlapping at least a portion of the layer of first active material, by means of spray-coating at an ambient gas pressure of at least about 1 kPa.

10. The method as claimed in claim 9, wherein the second active material differs substantially from the first active material with regard to colour emitted.

11. The method as claimed in claim 9, further comprising a step of depositing at least one charge-creating layer between the first and second active material layers.

12. The method as claimed in claim 1, comprising a step of providing at least one triplet emitter in or adjacent to at least one layer of active material, in an amount sufficient to provide an increase in device light generation efficiency.

13. The method as claimed in claim 12, wherein said triplet emitter comprises quantum dots.

14. The method as claimed in claim 1,
wherein the step of depositing the active material comprises:
a step of depositing an active material layer comprising an electrolyte, and
a step of depositing an active material layer which is substantially free from electrolyte, such that the electrolyte-free active material layer contacts the electrolyte comprising active material layer.

15. The method as claimed in claim 1, further comprising a step of applying a patterning mask, for forming a predetermined pattern, in connection with at least one of the deposition steps.

16. The method as claimed in claim 1, further comprising:
providing a substrate in the form of a continuous web or on a continuous web carrier,
unwinding at least part of the web or web carrier, and
performing at least one deposition step while the substrate is in the form of the continuous web or on the continuous web carrier.

17. The method as claimed in claim 1, wherein spraying parameters and ambient parameters are selected such that in the resulting deposited material, droplet features of overlapping droplets are distinguishable.

18. A light-emitting electrochemical cell manufactured according to the method as claimed in claim 1.

19. The light-emitting electrochemical cell as claimed in claim 18, wherein the cell provides a relative change in area-integrated light-emission intensity between more than 95%, or more than 99% or more than 99.9%, of neighboring 1×1 mm$^2$ areas of less than 20%, less than 10%, and less than 5%.

20. A light-emitting electrochemical cell comprising:
first and second electrodes;
a first light-emitting active material in electrical contact with and separating the first and second electrodes;
the first active material comprising mobile ions in an amount sufficient for doping the active material,
wherein the cell provides a relative change in area-integrated light-emission intensity between more than 95%, or more than 99% or more than 99.9%, of neighboring 1×1 mm$^2$ areas of less than 20%, less than 10%, and less than 5%, and
wherein the first active material is deposited in the form of spray droplets, wherein droplet features of overlapping droplets are distinguishable.

* * * * *